United States Patent
Park et al.

(10) Patent No.: US 10,217,821 B2
(45) Date of Patent: *Feb. 26, 2019

(54) POWER INTEGRATED DEVICES, ELECTRONIC DEVICES AND ELECTRONIC SYSTEMS INCLUDING THE SAME

(71) Applicant: SK HYNIX SYSTEM IC INC., Chungcheongbuk-Do (KR)

(72) Inventors: Joo Won Park, Chungcheongbuk-do (KR); Sang Hyun Lee, Gyeonggi-do (KR)

(73) Assignee: SK HYNIX SYSTEM IC INC., Chungcheongbuk-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/140,243

(22) Filed: Apr. 27, 2016

(65) Prior Publication Data
US 2016/0240662 A1 Aug. 18, 2016

Related U.S. Application Data

(63) Continuation-in-part of application No. 14/586,450, filed on Dec. 30, 2014, now Pat. No. 9,362,363.

(30) Foreign Application Priority Data
Sep. 1, 2014 (KR) .................. 10-2014-0115387

(51) Int. Cl.
*H01L 29/08* (2006.01)
*H01L 29/10* (2006.01)
(Continued)

(52) U.S. Cl.
CPC ........ *H01L 29/0886* (2013.01); *H01L 21/761* (2013.01); *H01L 21/76224* (2013.01);
(Continued)

(58) Field of Classification Search
CPC ............ H01L 21/762; H01L 21/02579; H01L 21/02576; H01L 21/041; H01L 21/0455;
(Continued)

(56) References Cited

U.S. PATENT DOCUMENTS 7,282,386 B2* 10/2007 Khemka ............... H01L 29/063
   438/92
8,338,872 B2* 12/2012 Khemka ............. H01L 27/0705
   257/299

(Continued)

*Primary Examiner* — Marcos D Pizarro
*Assistant Examiner* — Antonio Crite
(74) *Attorney, Agent, or Firm* — IP & T Group LLP

(57) ABSTRACT

A power integrated device includes a channel region, a source region, a drift region, and a drain region. A stacked gate includes a gate insulation layer and a gate electrode. The stacked gate having a plurality of stacked gate extension portions that extend from the stacked gate to over the plurality of deep trench field insulation layers. A plurality of deep trench field insulation layers is disposed in the drift region. The deep trench field insulation layers are spaced apart from each other in a channel width direction. A height of the deep trench field insulation layers is greater than a width of the deep trench field insulation layer.

11 Claims, 17 Drawing Sheets

(51) Int. Cl.
  *H01L 29/06* (2006.01)
  *H01L 29/78* (2006.01)
  *H01L 29/423* (2006.01)
  *H01L 21/761* (2006.01)
  *H01L 21/762* (2006.01)

(52) U.S. Cl.
  CPC ...... *H01L 29/0653* (2013.01); *H01L 29/0692* (2013.01); *H01L 29/0847* (2013.01); *H01L 29/0878* (2013.01); *H01L 29/1095* (2013.01); *H01L 29/4238* (2013.01); *H01L 29/7816* (2013.01); *H01L 29/7824* (2013.01); *H01L 29/7835* (2013.01)

(58) Field of Classification Search
  CPC ............... H01L 21/048; H01L 21/6205; H01L 21/76224; H01L 29/66613; H01L 29/66681; H01L 29/7816; H01L 29/7824; H01L 29/10; H01L 29/1095
  USPC ....... 257/347, 396, 350, 401, 288, 557, 607, 257/E21.014, E21.042, E21.045, E21.051, 257/E21.061, E21.14, E21.177, E21.32, 257/E21.373, E21.421, E21.435, 336
  See application file for complete search history.

(56) References Cited

U.S. PATENT DOCUMENTS

| | | | |
|---|---|---|---|
| 9,362,363 B2* | 6/2016 | Park | H01L 29/1095 |
| 2011/0147844 A1* | 6/2011 | Smith | H01L 29/0653 257/368 |
| 2012/0098055 A1* | 4/2012 | Darwish | H01L 29/0634 257/330 |
| 2012/0098062 A1* | 4/2012 | Pendharkar | H01L 29/0653 257/337 |
| 2013/0187218 A1* | 7/2013 | Lai | H01L 27/027 257/328 |
| 2013/0187231 A1* | 7/2013 | Lai | H01L 29/78 257/355 |
| 2013/0207179 A1* | 8/2013 | Lai | H01L 27/027 257/328 |
| 2014/0008725 A1* | 1/2014 | Chen | H01L 29/7816 257/343 |
| 2015/0097225 A1* | 4/2015 | Denison | H01L 29/7801 257/329 |
| 2015/0270333 A1* | 9/2015 | Yang | H01L 29/063 257/337 |
| 2015/0380402 A1* | 12/2015 | Park | H01L 29/7835 257/337 |

* cited by examiner

→ FIRST DIRECTION

POWER INTEGRATED DEVICES, ELECTRONIC DEVICES AND ELECTRONIC SYSTEMS INCLUDING THE SAME

CROSS-REFERENCE TO RELATED APPLICATION

This is a continuation-in-part of U.S. patent application Ser. No. 14/586,450, filed Dec. 30, 2014 and issued on Jun. 7, 2016 as U.S. Pat. No. 9,362,636, which claims the priority of Korean Patent Application No. 10-2014-0115387, filed on Sep. 1, 2014. This disclosures of all of the above applications are herein incorporated by reference in their entirely.

BACKGROUND

1. Technical Field

Various embodiments relate to semiconductor integrated circuits and, more particularly, to power integrated devices, electronic devices and electronic systems including the same.

2. Related Art

Integrated circuits serving as both a controller and a driver may be employed in smart power devices. Output circuits of the smart power devices may be designed to include lateral double diffused MOS (LDMOS) transistors operating at high voltages. Thus, breakdown voltages of the LDMOS transistors, for example, a drain junction breakdown voltage and a gate dielectric breakdown voltage, are important factors that may directly influence the stable operation of the LDMOS transistors. Additionally, on-resistance (Ron) of the LDMOS transistors is also an important factor that may influence electrical characteristics of the LDMOS transistors, for example, a current drivability of the LDMOS transistors. To improve the drain junction breakdown voltage of the LDMOS transistors, a doping concentration of a drift region between a drain region and a channel region should be reduced or a drift length of carriers in the drift region, corresponding to a length of a current path in the drift region, should be increased. However, the current drivability of the LDMOS transistors may be degraded, increasing the on-resistance (Ron) of the LDMOS transistors. In contrast, when the doping concentration of the drift region between the drain region and the channel region increases or the drift length in the drift region decreases, the on-resistance (Ron) of the LDMOS transistors may be reduced, thereby improving the current drivability of the LDMOS transistors. However, the drain junction breakdown voltages of the LDMOS transistors may be lowered. That is, in the LDMOS transistors, the on-resistance and the drain junction breakdown voltage may have a trade-off relationship.

SUMMARY

Various embodiments of the present disclosure are directed to power integrated devices, electronic devices, and electronic systems including the same.

According to an embodiment, a power integrated device includes a channel region disposed in a first region of a semiconductor layer, a source region disposed in a second region of the semiconductor layer, a drift region disposed in a third region of the semiconductor layer, wherein the channel region is disposed between the source region and the drift region in a first direction, a drain region disposed in the drift region, a stacked gate including a gate insulation layer and a gate electrode and extending from over the channel region to over the drift region, a plurality of deep trench field insulation layers each of which is disposed in the drift region, and between the stacked gate and the drain region in the first direction, and a plurality of stacked gate extension portions which extend from the stacked gate to over the plurality of deep trench field insulation layers in the first direction, respectively. The plurality of deep trench field insulation layers are spaced apart from each other in a second direction. The drift region has a different conductivity from the first region of a semiconductor layer. Each of the plurality of deep trench field insulation layers has a height greater than a width. The height is measured in a third direction and the width is measured in the first direction. And the third direction is perpendicular to each of the first and the second directions.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

Figure 1:
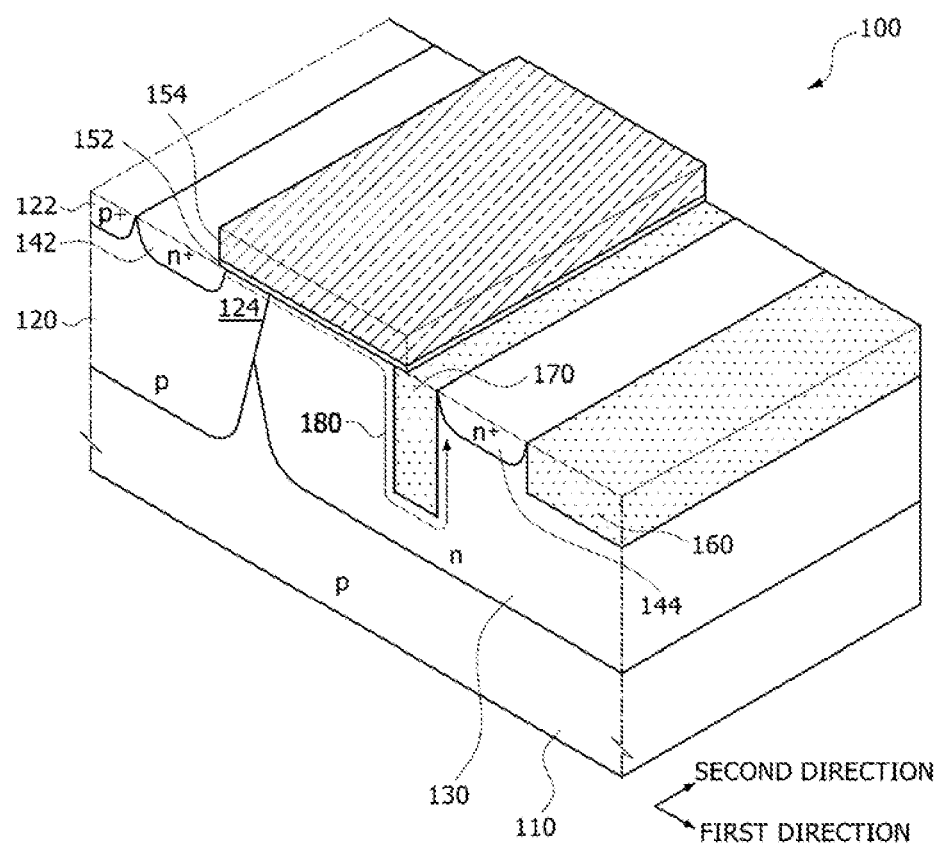
FIG. 1 is a perspective view illustrating a power integrated device according to an embodiment.

A shallow trench isolation (STI) layer and a trench field insulation layer may be employed in power integrated devices, such as lateral double diffused MOS (LDMOS) transistors. The STI layer may be used to isolate the adjacent LDMOS transistors from each other, and the trench field insulation layer may be used to alleviate the electric field created in the LDMOS transistors. The trench field insulation layer may have a similar structure to the STI layer. For example, each of the trench field insulation layer and the STI layer may be configured to include a trench having a predetermined depth and an insulation layer filling the trench. Thus, the trench field insulation layer and the STI layer may be simultaneously formed. The trench field insulation layer may have substantially the same size as the STI layer or a different dimension from the STI layer. In either case, the trench field insulation layer employed in general power integrated devices may have a shallow trench field insulation layer structure with an aspect ratio less than one. That is, a vertical height of the general trench field insulation layer may be less than a horizontal width of the general trench field insulation layer.

In contrast, according to an embodiment, each of trench field insulation layers employed in the LDMOS transistors may have a deep trench field insulation layer structure with an aspect ratio greater than one. In an embodiment, a drift length corresponding to a sum of two vertical heights of both sidewalls of the deep trench field insulation layer and a horizontal width of a bottom surface of the deep trench field insulation layer may be substantially equal to a drift length corresponding to a sum of two vertical heights of both sidewalls of the shallow trench field insulation layer employed in the general LDMOS transistors and a horizontal width of a bottom surface of the shallow trench field insulation layer employed in the general LDMOS transistors. Thus, as compared with the general power integrated devices, that is, the LDMOS transistors, the power integrated devices, that is, the LDMOS transistors according to an embodiment of the present disclosure may have substantially the same drift length and the same junction breakdown voltage as the general power integrated devices.

However, a width of the deep trench field insulation layer employed in the power integrated devices according to an embodiment may be less than a width of the shallow trench field insulation layer employed in the general power integrated devices. Thus, a planar area that the power integrated devices according to an embodiment occupy may be reduced without degradation of the current drivability as compared with the general power integrated devices. This may lead to improvement of the on-resistance of the power integrated devices.

In the following description, it will be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to be limiting.

In the drawings for convenience of illustration, thicknesses and lengths of components are exaggerated compared to actual physical thicknesses and lengths. For simplicity of description, a detailed description of known functions and elements may be omitted. Furthermore, "connected/coupled" may mean that one component is directly coupled to another component or indirectly coupled to another component through a third component. In this specification, a singular form may include a plural form unless it is specifically indicated otherwise. Furthermore, "include/comprise" or "including/comprising" used in the specification represents that one or more components, steps, operations, and elements exist or are added.

FIG. 1 is a perspective view illustrating a power integrated device 100 according to an embodiment. Referring to FIG. 1, the power integrated device 100 may include an LDMOS transistor. The LDMOS transistor may have a single channel, a P-type body region 120, and an N-type drift region 130 disposed in an upper portion of a P-type substrate 110. The P-type body region 120 and the N-type drift region 130 may be disposed in a first direction to contact each other at an interfacial region therebetween. A P-type body contact region 122 and an N-type source region 142 may be disposed in an upper region of the P-type body region 120. Each of the P-type body contact region 122 and the N-type source region 142 may be a stripe shape that extends in a second direction crossing the first direction. The P-type body contact region 122 and the N-type source region 142 may be exposed to a top surface of the P-type body region 120. An upper region of the P-type body region 120 between the N-type source region 142 and the N-type drift region 130 may serve as a single channel region 124. In the single channel region 124, an inversion layer is formed under a certain condition. The P-type body contact region 122 and the N-type source region 142 may have impurity concentrations which are higher than an impurity concentration of the P-type body region 120. The P-type body contact region 122 and the N-type source region 142 may be biased to have the same electric potential. For example, the P-type body contact region 122 and the N-type source region 142 may be connected to a ground line. An N-type drain region 144 may be disposed in an upper region of the N-type drift region 130 and may be exposed at a top surface of the N-type drift region 130. The N-type drain region 144 may have an impurity concentration which is higher than that of the N-type drift region 130. The N-type drain region 144 may be a stripe shape extending in the second direction. A gate insulation layer 152 and a gate electrode 154 may be sequentially stacked on the channel region 124. The gate insulation layer 152 and the gate electrode 154 may extend onto the N-type drift region 130 between the P-type body region 120 and the N-type drain region 144. Each of the gate insulation layer 152 and the gate electrode 154 may be a stripe shape extending in the second direction.

A trench isolation layer 160 and a deep trench field insulation layer 170 may be disposed in the N-type drift region 130. The trench isolation layer 160 and the deep trench field insulation layer 170 may be exposed to a top surface of the N-type drift region 130. The trench isolation layer 160 may be disposed at one side of the N-type drain region 144 to have a stripe shape which is parallel to the N-type drain region 144. The trench isolation layer 160 may physically and electrically isolate the power integrated device 100 from other devices. The deep trench field insulation layer 170 may be disposed opposite to the trench isolation layer 160 with respect to the N-type drain region 144. The deep trench field insulation layer 170 may also extend in the second direction and have a stripe shape parallel to the N-type drain region 144. As illustrated in FIG. 1, the deep trench field insulation layer 170 may be disposed in the N-type drift region 130 between the P-type body region 120 and the N-type drain region 144, and the gate electrode 154 may be spaced apart from the N-type drain region 144 by the deep trench field insulation layer 170. Thus, the deep trench field insulation layer 170 may suppress a field crowding phenomenon occurring at an edge of the gate electrode 154 which is adjacent to the N-type drain region 144, thereby improving a drain junction breakdown voltage characteristic and a gate dielectric breakdown voltage characteristic of the power integrated device 100.

Although FIG. 1 illustrates an example in which the deep trench field insulation layer 170 and the trench isolation layer 160 directly contact both edges of the N-type drain region 144, respectively, the embodiment is not limited thereto. For example, in another embodiment, at least one of the deep trench field insulation layer 170 and the trench isolation layer 160 may be disposed spaced apart from the N-type drain region 144. The trench isolation layer 160 may be disposed at one or a first side of the N-type drain region 144, and the deep trench field insulation layer 170 may be disposed at the other or a second side of the N-type drain region 144. The second side is the opposite side to the first side. The deep trench field insulation layer 170 may overlap with an edge of the gate insulation layer 152 and an edge of the gate electrode 154. Alternatively, the deep trench field insulation layer 170 may be spaced apart from the gate insulation layer 152 and the gate electrode 154.

Figure 2A:
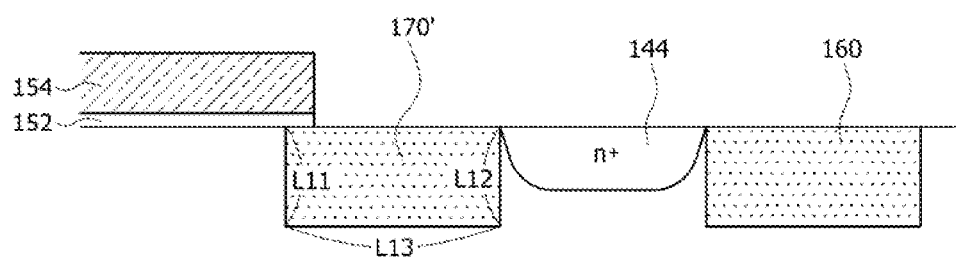
FIG. 2A is a shallow trench field insulation structure employed in a general power integrated device.
Figure 2B:
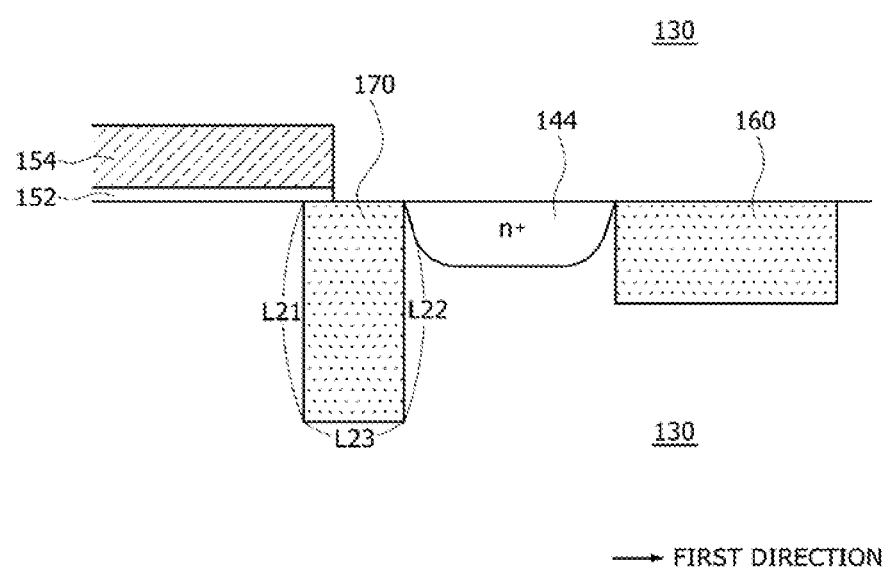
FIG. 2B is a merged cross-sectional view illustrating a deep trench field insulation structure included in the power integrated device of FIG. 1.

FIG. 2A is a cross-sectional view illustrating the deep trench field insulation layer 170 included in the power integrated device 100 of FIG. 1. FIG. 2B is a cross-sectional view illustrating a shallow trench field insulation layer 170' employed in a general power integrated device. Although, in FIG. 2A and FIG. 2B, both of the deep trench field insulation layer 170 and the general shallow trench field insulation layer 170' have vertical sidewall profiles, embodiments are not limited thereto. For example, in another embodiment, each of the deep trench field insulation layer 170 and the general shallow trench field insulation layer 170' may have sloped sidewall profiles. These sidewall profiles of the deep trench field insulation layer 170 and the general shallow trench field insulation layer 170' are applicable to any of the following embodiments.

Referring to FIG. 2A, a first sidewall of the general shallow trench field insulation layer 170' may have a first vertical length L11, that is, a first height. A second sidewall of the general shallow trench field insulation layer 170' may have a second vertical length L12, that is, a second height. A bottom surface of the general shallow trench field insulation layer 170' may have a horizontal length L13, that is, a width, extending in the first direction. The first direction may be substantially antiparallel with a direction in which a drain current flows from the N-type drain region 144 toward the N-type source region (142 of FIG. 1).

Referring to FIG. 2B, the deep trench field insulation layer 170 may have a first vertical length L21, that is, a first height at a first sidewall, a second vertical length L22, that is, a second height at a second sidewall, and a horizontal length L23, that is, a width measured along a bottom surface in the first direction. In an embodiment, the first height L21 and the second height L22 of the deep trench field insulation layer 170 may be substantially equal to each other. The first and second heights L21 and L22 of the deep trench field insulation layer 170 may be greater than the width 123 of the deep trench field insulation layer 170. For example, the first and second heights L21 and L22 of the deep trench field insulation layer 170 may be at least 1.2 times greater than the width L23 of the deep trench field insulation layer 170.

In contrast, in FIG. 2A, the first and second heights L11 and L12 of the general shallow trench field insulation layer 170' may be less than the width L13 of the general shallow trench field insulation layer 170'. In an embodiment, a total sum of the first height 121, the second height L22 and the width 123 of the deep trench field insulation layer 170 may be equal to a total sum of the first height L11, the second height L12 and the width L13 of the general shallow trench field insulation layer 170'.

Referring again to FIGS. 1, 2A, and 2B, if the P-type body contact region 122 and the N-type source region 142 are grounded and a drain voltage and a gate voltage for example, a gate voltage over a threshold voltage, are respectively applied to the N-type drain region 144 and the gate electrode 154, an inversion layer may be formed in the single channel region 124 and a drain current may flow through the inversion layer. That is, electrons emitted from the N-type source region 142 may drift toward the N-type drain region 144 through the inversion layer in the single channel region 124 and the N-type drift region 130 due to an electric field created between the N-type source region 142 and the N-type drain region 144, along a current path indicated by a dotted line 180. When the electrons emitted from the N-type source region 142 drift toward the N-type drain region 144, the electrons may move along the sidewalls and a bottom surface of the deep trench field insulation layer 170. Accordingly, a movement distance hereinafter, referred to as a drift length, of the electrons along the deep trench field insulation layer 170 may be equal to a sum of the first height L21, the second height L22, and the width L23 of the deep trench field insulation layer 170.

If the drift length increases, a drain junction breakdown voltage characteristic of the power integrated device 100 may be improved but a drain current drivability of the power integrated device 100 may degrade. If the drift length reduces, a drain current drivability of the power integrated device 100 may improve but a drain junction breakdown voltage characteristic of the power integrated device 100 may degrade. In the power integrated device 100 according to an embodiment, the drift length may correspond to a sum of the first height L21, the second height L22, and the width L23 of the deep trench field insulation layer 170. The drift length of the power integrated device 100 may be substantially equal to a sum of the first height L11, the second height L12 and the width L13 of the general shallow trench field insulation layer 170'. That is, since the drift length of the power integrated device 100 employing the deep trench field insulation layer 170 is substantially equal to the drift length of the general power integrated device employing the shallow trench field insulation layer 170', the power integrated device 100 may exhibit substantially the same drain junction breakdown voltage characteristic as the general power integrated device employing the shallow trench field insulation layer 170'.

Figure 3:
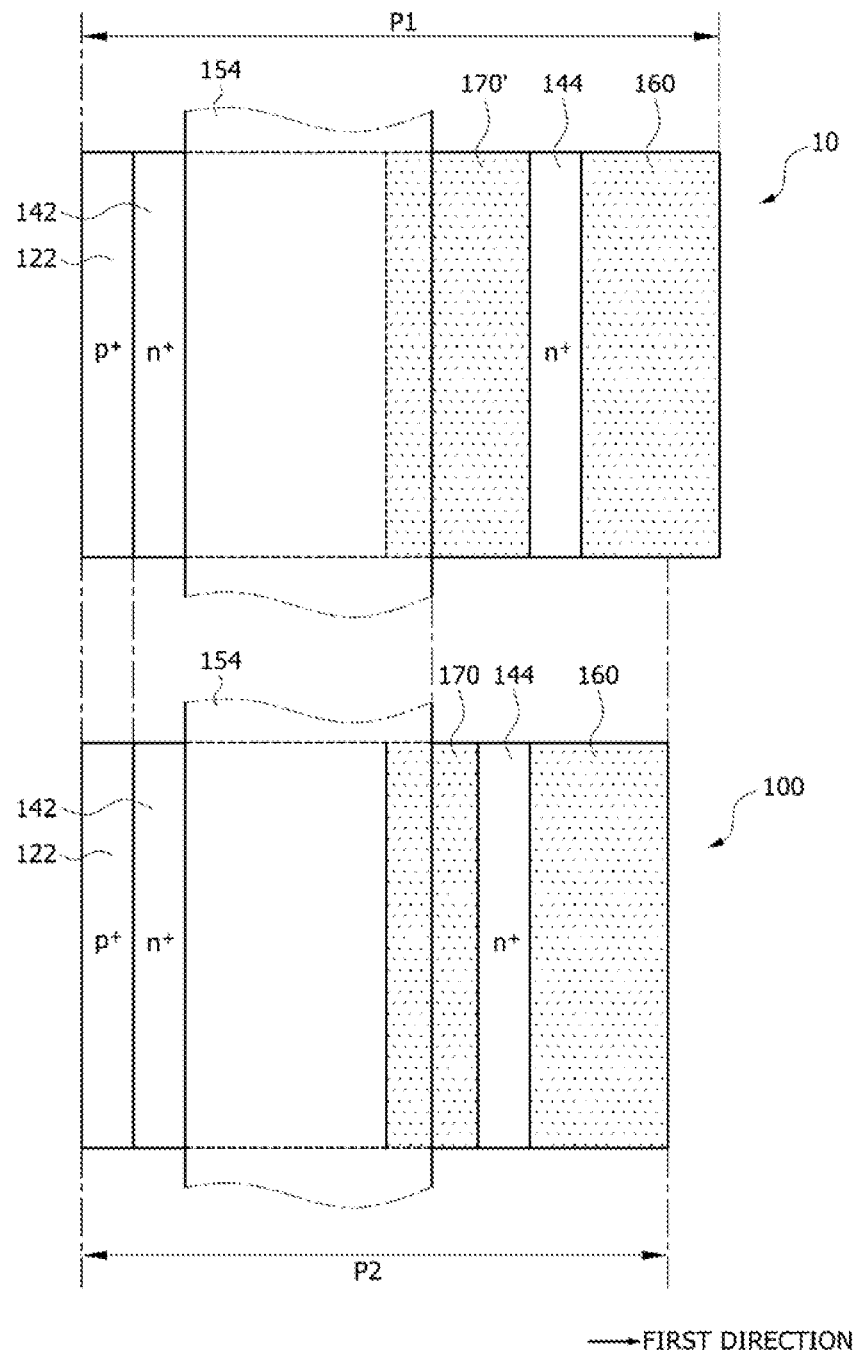
FIG. 3 is a merged layout diagram illustrating the power integrated device of FIG. 1 and the power integrated device with the shallow trench field insulation structure shown in FIG. 2A.

FIG. 3 is a merged layout diagram illustrating the power integrated device 100 of FIG. 1 and a general power integrated device 10 with the shallow trench field insulation layer 170' shown in FIG. 2A that exhibits an improved effect of a current drivability of the power integrated device 100 shown in FIG. 1. In FIG. 3, the same reference numerals used in FIG. 1 denote the same or the like elements. Accordingly, for the purpose of ease and convenience, the descriptions of the same elements as illustrated in FIG. 1 will be omitted or briefly mentioned.

Referring to FIG. 3, a layout diagram of the power integrated device 10 according to an embodiment is illustrated in the top of FIG. 3 and a layout diagram of the general power integrated device 100 corresponding to a comparative example is illustrated in the bottom of FIG. 3. The power integrated device 100 according to an embodiment has the deep trench field insulation layer 170, and each of the first height (L21 of FIG. 2) and the second height (L22 of FIG. 2) of the deep trench field insulation layer 170 is greater than the width (L23 of FIG. 2) of the deep trench field insulation layer 170. In contrast, the general power integrated device 10 has the shallow trench field insulation layer 170', and each of the first height (L11 of FIG. 2) and the second height (L12 of FIG. 2) of the shallow trench field insulation layer 170' is smaller than the width (L13 of FIG. 2) of the shallow trench field insulation layer 170'.

As can be seen from FIG. 3, a total pitch P1 of the power integrated device 100 measured along the first direction may be shorter than a total pitch P2 of the general power integrated device 10 measured along the first direction. This is due to the width (L23 of FIG. 2) of the deep trench field insulation layer 170 employed in the power integrated device 100 being shorter than the width (L13 of FIG. 2) of the shallow trench field insulation layer 170' employed in the general power integrated device 10.

To verify an improved effect of a current drivability of the power integrated device 100 shown in FIG. 1, the shallow trench field insulation layer 170' is prepared having the first and second heights L11 and L12 of 0.35 micrometers and the width L13 of 3.5 micrometers. The deep trench field insulation layer 170 is prepared having the first and second heights L21 and L22 of 1.4 micrometers and the width L23 of 1.0 micrometer. Then the device parameters are calculated or simulated.

For the simulation, the other conditions such as dimension, size, material, or impurity concentration are set the same in both of the general power integrated device 10 and the power integrated device 100. The pitch P1 of the general power integrated device 10 was about 5.95 micrometers and the pitch P2 of the power integrated device 100 was about 3.55 micrometers. As a result of the simulation, the drain junction breakdown voltage of the general power integrated device 10 was about 78.1 volts, and the drain junction breakdown voltage of the power integrated device 100 was about 79.4 volts. That is, the drain junction breakdown voltage of the power integrated device 100 showed very little difference from or was almost equal to that of the general power integrated device 10 even though the width L23 of the deep trench field insulation layer 170 was adjusted to be shorter than the width L13 of the shallow trench field insulation layer 170'.

The general power integrated device 10 exhibited an on-resistance value of about 67.8 mΩ/mm$^2$, and the power integrated device 100 exhibited an on-resistance value of about 48.8 mΩ/mm$^2$. This may be due to the pitch size of the power integrated device 100 being shorter than the pitch size of the general power integrated device 10. Accordingly, the power integrated device 100 exhibits an improved on-resistance characteristic as compared with the general power integrated device 10.

Referring to FIGS. 2A and 2B, the drift length of the power integrated device 100 may be substantially equal to the drift length of the general power integrated device 10. Thus, the power integrated device 100 may exhibit substantially the same drain junction breakdown voltage characteristic as the general power integrated device 10. However, the pitch P2 of the power integrated device 100, which is measured along the first direction in parallel to the drain current direction, may be shorter than the pitch P1 of the general power integrated device 10. Thus, the on-resistance characteristic of the power integrated device 100 may be improved as compared with the general power integrated device 10. That is, according to an embodiment, the on-resistance characteristic of the power integrated device 100 may be improved without any degradation in the drain junction breakdown voltage characteristic. This advantage of the power integrated device 100 may be more effectively observed when a plurality of power integrated devices 100, are integrated in a single substrate.

Figure 4:
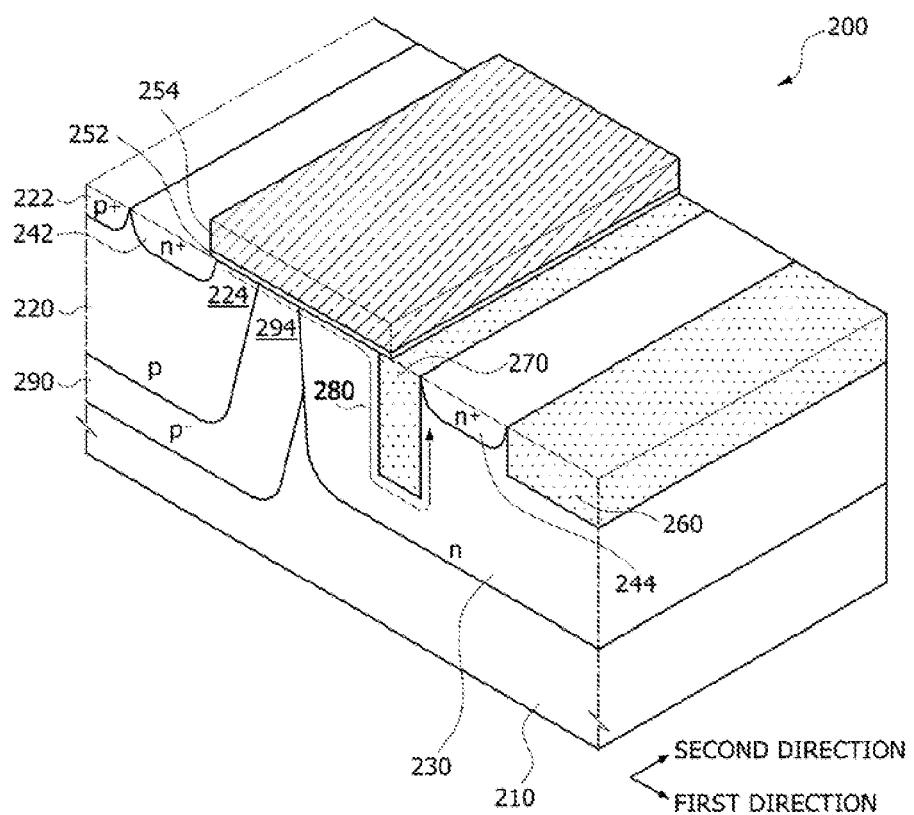
FIG. 4 is a perspective view illustrating a power integrated device according to another embodiment.

FIG. 4 is a perspective view illustrating a power integrated device 200 according to another embodiment. Referring to FIG. 4, the power integrated device 200 may include an LDMOS transistor having sectional channels. A P-type body region 220 and an N-type drift region 230 are disposed in an upper portion of a substrate 210. The P-type body region 220 and the N-type drift region 230 may be arrayed in a first direction and spaced apart from each other. Sidewalls and a bottom surface of the P-type body region 220 may be surrounded by a P-type well region 290 disposed in the substrate 210. The P-type well region 290 may have an impurity concentration which is lower than that of the P-type body region 220. A sidewall of the P-type well region 290 may contact a sidewall of the N-type drift region 230. If the substrate 210 has P-type conductivity and has an appropriate surface impurity concentration when used as a channel region, the P-type well region 290 may be omitted. Although not shown in FIG. 4, an N-type well region may be additionally disposed in the substrate 210 to surround the P-type well region 290 and the N-type drift region 230.

A P-type body contact region 222 and an N-type source region 242 may be disposed in an upper region of the P-type body region 220. The P-type body contact region 222 and the N-type source region 242 may have stripe shapes that extend in a second direction crossing the first direction. The P-type body contact region 222 and the N-type source region 242 may be exposed to a top surface of the P-type body region 220.

An upper region of the P-type body region 220 between the N-type source region 242 and the P-type well region 290 may serve as a first channel region 224 in which an inversion layer is formed under a certain condition. Similarly, an upper region of the P-type well region 290 between the P-type body region 220 and the N-type drift region 230 may serve as a second channel region 294 in which an inversion layer is formed under a certain condition.

The P-type body contact region 222 and the N-type source region 242 may have impurity concentrations which are higher than an impurity concentration of the P-type body region 220. The P-type body contact region 222 and the N-type source region 242 may be biased to have the same electric potential. For example, the P-type body contact region 222 and the N-type source region 242 may be connected to a ground line. A N-type drain region 244 may be disposed in an upper region of the N-type drift region 230 and may be exposed to a top surface of the N-type drift region 230. The N-type drain region 244 may have an impurity concentration which is higher than that of the N-type drift region 230. The N-type drain region 244 may be disposed to have a stripe shape extending in the second direction.

A gate insulation layer 252 and a gate electrode 254 may be sequentially stacked on the first and second channel regions 224 and 294. The gate insulation layer 252 and the gate electrode 254 may extend onto the N-type drift region 230. The gate insulation layer 252 and the gate electrode 254 may also be disposed to have stripe shapes extending in the second direction.

A trench isolation layer 260 and a deep trench field insulation layer 270 may be disposed in the N-type drift region 230. The trench isolation layer 260 and the deep trench field insulation layer 270 may be exposed to a top surface of the N-type drift region 230. The trench isolation layer 260 may be disposed at one side of the N-type drain region 244 to have a stripe shape which is parallel to the N-type drain region 244. The trench isolation layer 260 may physically and electrically isolate the power integrated device 200 from other devices. The deep trench field insulation layer 270 may be disposed at the other side of the N-type drain region 244. The deep trench field insulation layer 270 may also extend in the second direction to have a stripe shape which is parallel to the N-type drain region 244.

As illustrated in FIG. 4, the deep trench field insulation layer 270 may be disposed in the N-type drift region 230 between the P-type well region 290 and the N-type drain region 244, and the gate electrode 254 may be spaced apart from the N-type drain region 244 by the deep trench field insulation layer 270. Thus, the deep trench field insulation layer 270 may suppress a field crowding phenomenon occurring at an edge of the gate electrode 254 which is adjacent to the N-type drain region 244, thereby improving a drain junction breakdown voltage characteristic and a gate dielectric breakdown voltage characteristic of the power integrated device 200.

Although FIG. 4 illustrates an example in which the deep trench field insulation layer 270 and the trench isolation layer 260 directly contact side edges of the N-type drain region 244, the embodiment not limited thereto. For example, in another embodiment, at least one of the deep trench field insulation layer 270 and the trench isolation layer 260 may be disposed spaced apart from the N-type drain region 244. The trench isolation layer 260 may be disposed at one side of the N-type drain region 244. The deep trench field insulation layer 270 may be disposed at the other side of the N-type drain region 244. The deep trench field insulation layer 270 may be disposed to overlap with an edge of the gate insulation layer 252 and an edge of the gate electrode 254. Alternatively, the deep trench field insulation layer 270 may be spaced apart from the gate insulation layer 252 and the gate electrode 254.

As described with reference to FIGS. 2A and 2B, a first height and a second height of two opposing sidewalls of the deep trench field insulation layer 270 may be greater than a width of a bottom surface of the deep trench field insulation layer 270. In an embodiment, each of the first and second heights of the deep trench field insulation layer 270 may be at least 1.2 times greater than the width of the deep trench field insulation layer 270. That is, the height of the deep trench field insulation layer 270 may be greater than the height of the general shallow trench field insulation layer 170' shown in FIG. 2A. The width of the deep trench field insulation layer 270 measured along the first direction may be shorter than the width of the general shallow trench field insulation layer 170' shown in FIG. 2. A total sum of the first height, the second height, and the width of the deep trench field insulation layer 270 may be equal to a total sum of the first height L11, the second height L12, and the width L13 of the general shallow trench field insulation layer 170' shown in FIG. 2A.

If the P-type body contact region 222 and the N-type source region 242 are grounded and a drain voltage and a gate voltage, for example, a gate voltage over a threshold voltage, are respectively applied to the N-type drain region 244 and the gate electrode 254, an inversion layer may be formed in the first and second channel regions 224 and 294 and a drain current may flow through the inversion layer. That is, electrons emitted from the N-type source region 242 may drift toward the N-type drain region 244 through the inversion layer in the first and second channel regions 224 and 294 and the N-type drift region 230 by an electric field, which is created between the N-type source region 242 and the N-type drain region 244, along a current path indicated by a dotted line 280. While the electrons emitted from the N-type source region 242 drift toward the N-type drain region 244, the electrons may move along the sidewalls and a bottom surface of the deep trench field insulation layer 270.

A drift length of the electrons in the power integrated device 200 may correspond to a sum of the first height, the second height and the width of the deep trench field insulation layer 270. The drift length of the electrons in the power integrated device 200 may be substantially equal to a sum of the first height L11, the second height L12, and the width L13 of the general shallow trench field insulation layer 170' illustrated in FIG. 2A. Thus, the power integrated device 200 may exhibit substantially the same drain junction breakdown voltage characteristic as the general power integrated device 10 illustrated in FIGS. 2A and 3.

As described with reference to FIG. 3, a pitch of the power integrated device 200 in the first direction may be shorter than the pitch P1 of the general power integrated device 10 illustrated in FIG. 3. Thus, an on-resistance characteristic of the power integrated device 200 may be improved as compared with the general power integrated device 10. That is, according to the embodiment shown in FIG. 4, the on-resistance characteristic of the power integrated device 200 may be improved without any degradation of the drain junction breakdown voltage characteristic. This advantage of the power integrated device 200 may be more effectively revealed when a plurality of power integrated devices 200 are integrated in a single substrate.

Figure 5:
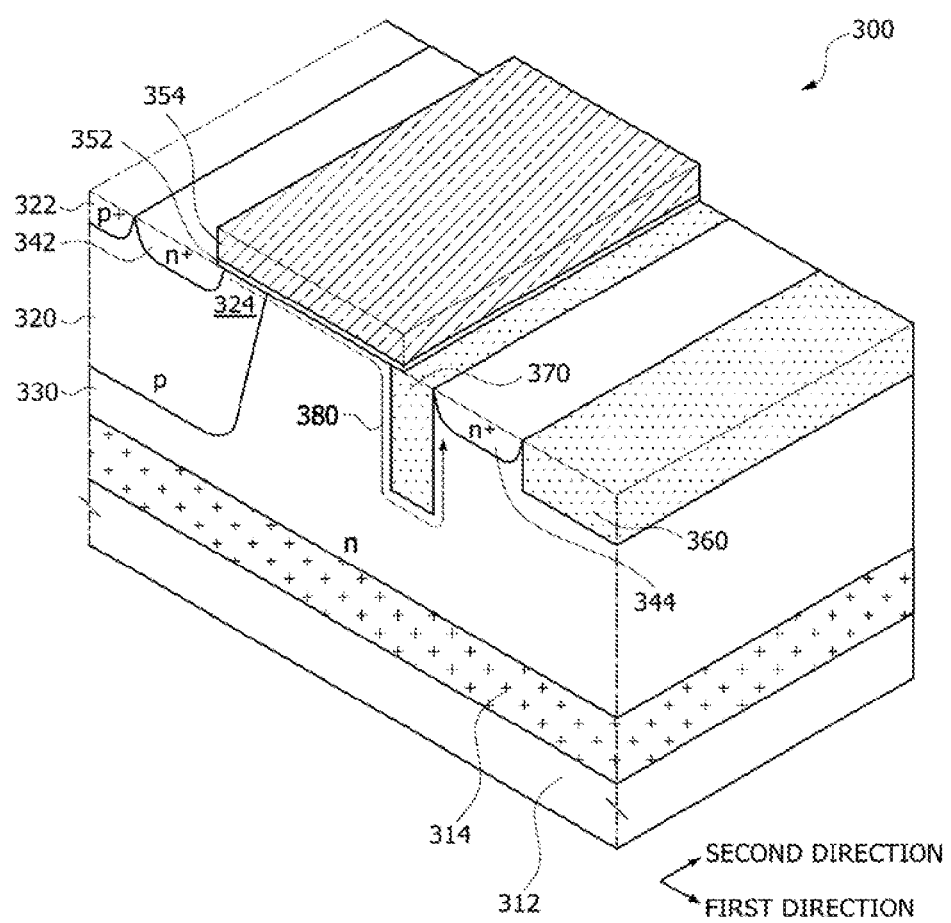
FIG. 5 is a perspective view illustrating a power integrated device according to still another embodiment.

FIG. 5 is a perspective view illustrating a power integrated device 300 according to still another embodiment. Referring to FIG. 5, the power integrated device 300 may be configured to include an LDMOS transistor disposed on a silicon-on-insulator (SOI) substrate.

The SOI substrate may include a support substrate 312, a buried insulation layer 314 on the support substrate 312, and an N-type drift layer 330 on the buried insulation layer 314. In an embodiment, the buried insulation layer 314 may be an oxide layer. The N-type drift layer 330 may be a single crystalline silicon layer doped with N-type impurity ions. The N-type drift layer 330 may be separated from the support substrate 312 by the buried insulation layer 314. Thus, carriers such as electrons or holes may be stored or drifted in the N-type drift layer 330. That is, no current flows from the N-type drift layer 330 toward the support substrate 312 due to the presence of the buried insulation layer 314. Accordingly, if the LDMOS transistor is formed on the SOI substrate, an operation speed of the LDMOS transistor may be improved. Moreover, since the depth of the N-type drift layer 330 is defined by the SOI substrate, a total volume of a depletion region, which is created in the N-type drift layer 330 when the LDMOS transistor is in a switching operation, may be reduced. As a result, a switching voltage, that is, a threshold voltage, of the LDMOS transistor may be lowered and a switching speed of the LDMOS transistor may improve.

A P-type body region 320 and an N-type drain region 344 may be arrayed in a first direction in an upper portion of the N-type drift layer 330 spaced apart from each other. A P-type body contact region 322 and an N-type source region 342 may be disposed in an upper region of the P-type body region 320. The P-type body contact region 322 and the N-type source region 342 may have stripe shapes that extend in a second direction crossing the first direction. The P-type body contact region 322 and the N-type source region 342 may be exposed to a top surface of the P-type body region 320. An upper region of the P-type body region 320 between the N-type source region 342 and the N-type drift region 330 may serve as a channel region 324 in which an inversion layer is formed under a certain condition. Each of the P-type body contact region 322 and the N-type source region 342 may have an impurity concentration which is higher than an impurity concentration of the P-type body region 320. The P-type body contact region 322 and the N-type source region 342 may be biased to have the same electric potential. For example, the P-type body contact region 322 and the N-type source region 342 may be connected to a ground line. The N-type drain region 344 may be exposed to a top surface of the N-type drift region 330. The N-type drain region 344 may have an impurity concentration which is higher than that of the N-type drift region 330. The N-type drain region 344 may have a stripe shape extending in the second direction. A gate insulation layer 352 and a gate electrode 354 may be sequentially stacked on the channel region 324. The gate insulation layer 352 and the gate electrode 354 may further extend onto the N-type drift region 330. The gate insulation layer 352 and the gate electrode 354 may also have stripe shapes extending in the second direction.

A trench isolation layer 360 and a deep trench field insulation layer 370 may be disposed in the N-type drift region 330. The trench isolation layer 360 and the deep trench field insulation layer 370 may be exposed to a top surface of the N-type drift region 330. The trench isolation layer 360 may be disposed at one side of the N-type drain region 344 and have a stripe shape which is parallel to the N-type drain region 344. The trench isolation layer 360 may physically and electrically isolate the power integrated device 300 from other devices. The deep trench field insulation layer 370 may be disposed at the other side of the N-type drain region 344. The deep trench field insulation layer 370 may also extend in the second direction and have a stripe shape which is parallel to the N-type drain region 344. As illustrated in FIG. 5, the deep trench field insulation layer 370 may be disposed in the N-type drift region 330 between the P-type body region 320 and the N-type drain region 344, and the gate electrode 354 may be spaced apart from the N-type drain region 344 by the deep trench field insulation layer 370. Thus, the deep trench field insulation layer 370 may suppress a field crowding phenomenon occurring at an edge of the gate electrode 354 which is adjacent to the N-type drain region 344, thereby improving a drain junction breakdown voltage characteristic and a gate dielectric breakdown voltage characteristic of the power integrated device 300.

Although FIG. 5 illustrates an example in which the deep trench field insulation layer 370 and the trench isolation layer 360 directly contact side edges of the N-type drain region 344, the embodiment is not limiting. For example, in another embodiment, at least one of the deep trench field insulation layer 370 and the trench isolation layer 360 may be spaced apart from the N-type drain region 344. The trench isolation layer 360 may be disposed at one side of the N-type drain region 344, and the deep trench field insulation layer 370 may be disposed at the other side of the N-type drain region 344. The deep trench field insulation layer 370 may overlap an edge of the gate insulation layer 352 and an edge of the gate electrode 354. In another embodiment, the deep trench field insulation layer 370 may be spaced apart from the gate insulation layer 352 and the gate electrode 354.

As described with reference to FIG. 2B, a first height and a second height of two opposing sidewalls of the deep trench field insulation layer 370 may be greater than a width of a bottom surface of the deep trench field insulation layer 370.

In another embodiment, the first and second heights of the deep trench field insulation layer 370 may be at least 1.2 times greater than the width of the deep trench field insulation layer 370. The width may be measured in the first direction. That is, the height of the deep trench field insulation layer 370 may be greater than the height of the general shallow trench field insulation layer 170' shown in FIG. 2A, and the width of the deep trench field insulation layer 370 in the first direction may be shorter than the width of the general shallow trench field insulation layer 170' shown in FIG. 2A. A total sum of the first height, the second height, and the width of the deep trench field insulation layer 370 may be equal to a total sum of the first height L11, the second height L12, and the width L13 of the general shallow trench field insulation layer 170' shown in FIG. 2A.

When the P-type body contact region 322 and the N-type source region 342 are grounded and a drain voltage and a gate voltage, for example, a gate voltage over a threshold voltage, are respectively applied to the N-type drain region 344 and the gate electrode 354, an inversion layer may be formed in the channel region 324 and a drain current may flow through the inversion layer. That is, electrons emitted from the N-type source region 342 may be drifted toward the N-type drain region 344 through the inversion layer in the channel region 324 and the N-type drift region 330 by an electric field, which is created between the N-type source region 342 and the N-type drain region 344, along a current path indicated by a dotted line 380. When the electrons emitted from the N-type source region 342 drift toward the N-type drain region 344, the electrons may move along the sidewalls and a bottom surface of the deep trench field insulation layer 370.

A drift length of the electrons in the power integrated device 300 may correspond to a sum of the first height, the second height, and the width of the deep trench field insulation layer 370. The drift length of the electrons in the power integrated device 300 may be substantially equal to a sum of the first height L11, the second height L12, and the width L13 of the general shallow trench field insulation layer 170' illustrated in FIG. 2A. Thus, the power integrated device 300 may exhibit substantially the same drain junction breakdown voltage characteristic as the general power integrated device 10 illustrated in FIGS. 2A and 3.

As described with reference to FIG. 3, a pitch of the power integrated device 300 in the first direction may be shorter than the pitch P1 of the general power integrated device 10 illustrated in FIG. 3. Thus, an on-resistance characteristic of the power integrated device 300 may be improved as compared with the general power integrated device 10. That is, according to an embodiment, the on-resistance characteristic of the power integrated device 300 may be improved without any degradation of the drain junction breakdown voltage characteristic. This advantage of the power integrated device 300 may be more effectively observed when a plurality of power integrated devices 300 is integrated in a single substrate.

Figure 6:
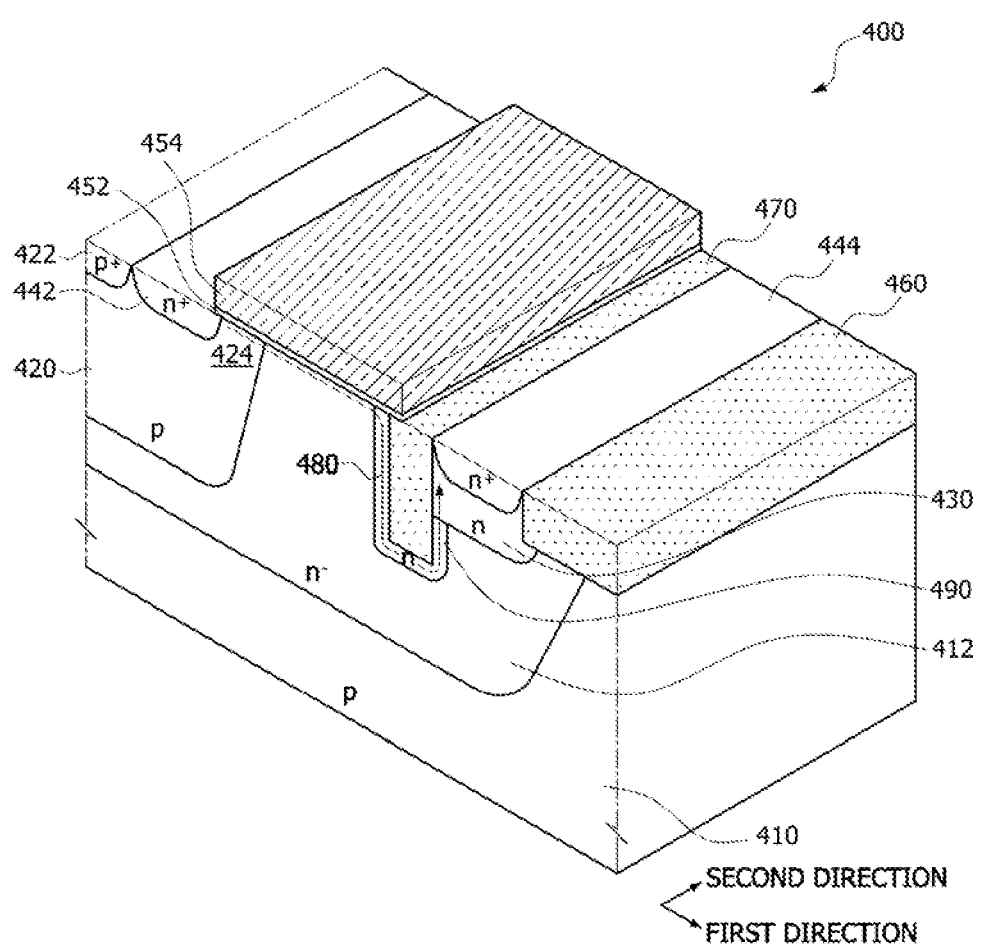
FIG. 6 is a perspective view illustrating a power integrated device according to yet another embodiment.

FIG. 6 is a perspective view illustrating a power integrated device 400 according to yet another embodiment. Referring to FIG. 6, the power integrated device 400 may be configured to include an N-type well region 412. The N-type well region 412 may be disposed in an upper region of a P-type substrate 410. The N-type well region 412 may serve as a first drift region. A P-type body region 420 and an N-type drift region 430 may be disposed spaced apart from each other in an upper region of the N-type well region 412. The P-type body region 420 and the N-type drift region 430 may be arrayed in a first direction. The N-type drift region 430 may serve as a second drift region.

The N-type well region 412 may have an impurity concentration lower than the impurity concentrations of the N-type drift regions 130, 230 and 330 of the structures shown in FIGS. 1, 4, and 5. The N-type well region 412 may have the impurity concentration corresponding to a drain bulk region of the power integrated device 400. Thus, a width of a depletion region created in the N-type well region 412 when a reverse bias, that is, a drain voltage, is applied between the P-type body region 420 and the N-type well region 412 may be greater than widths of depletion regions created in the N-type drift regions 130, 230 and 330 when the drain voltages are applied to the power integrated devices 100, 200 and 300, which are respectively shown in FIGS. 1, 4, and 5. As a result, the power integrated device 400 including the N-type well region 412 may exhibit a drain junction breakdown voltage which is higher than the drain junction breakdown voltages of the power integrated devices 100, 200 and 300.

The N-type drift region 430 may have an impurity concentration which is higher than an impurity concentration of the N-type well region 412. That is, the N-type drift region 430 may have conductivity higher than the conductivity of the N-type well region 412. Accordingly, the N-type drift region 430 may compensate for degradation of an on-resistance characteristic of the power integrated device 400. The P-type body region 420 may be formed by selectively diffusing P-type impurities into a portion of the N-type well region 412, and the N-type drift region 430 may be formed by selectively diffusing N-type impurities into another portion of the N-type well region 412.

A P-type body contact region 422 and an N-type source region 442 may be disposed in an upper region of the P-type body region 420. The P-type body contact region 422 and the N-type source region 442 may be disposed to have stripe shapes that extend in a second direction crossing the first direction. The P-type body contact region 422 and the N-type source region 442 may be exposed to a top surface of the P-type body region 420.

An upper region of the P-type body region 420 between the N-type source region 442 and the N-type well region 412 may serve as a channel region 424 in which an inversion layer is formed under a certain condition. The P-type body contact region 422 and the N-type source region 442 may have impurity concentrations which are higher than an impurity concentration of the P-type body region 420. The P-type body contact region 422 and the N-type source region 442 may be biased to have the same electric potential. For example, the P-type body contact region 422 and the N-type source region 442 may be connected to a ground line.

A N-type drain region 444 may be disposed in an upper region of the N-type drift region 430. The N-type drain region 444 may have an impurity concentration which is higher than that of the N-type drift region 430. The N-type drain region 444 may be disposed to have a stripe shape extending in the second direction. A gate insulation layer 452 and a gate electrode 454 may be sequentially stacked on the channel region 424. The gate insulation layer 452 and the gate electrode 454 may further extend onto the N-type well region 412. The gate insulation layer 452 and the gate electrode 454 may also be disposed to have stripe shapes extending in the second direction.

A trench isolation layer 460 and a deep trench field insulation layer 470 may be disposed in an upper region of the N-type well region 412. The trench isolation layer 460 and the deep trench field insulation layer 470 may be exposed to a top surface of the N-type well region 412. The depth of the trench isolation layer 460 may be shallower than the depth of the N-type drift region 430. The depth of the deep trench field insulation layer 470 may be deeper than the depth of the N-type drift region 430. Thus, a bottom surface of the deep trench field insulation layer 470 may be located at a lower level than a bottom surface of the N-type drift region 430, and a bottom surface of the trench isolation layer 460 may be located at an upper level than a bottom surface of the N-type drift region 430.

The trench isolation layer 460 may be disposed at one side of the N-type drain region 444 and have a stripe shape which is parallel to the N-type drain region 444. The trench isolation layer 460 may physically and electrically isolate the power integrated device 400 from other devices. The deep trench field insulation layer 470 may be disposed at the other side of the N-type drain region 444. The deep trench field insulation layer 470 may also extend in the second direction to have a stripe shape which is parallel to the N-type drain region 444.

As illustrated in FIG. 6, the deep trench field insulation layer 470 may be disposed in the N-type well region 412 between the P-type body region 420 and the N-type drain region 444. The gate electrode 454 may be spaced apart from the N-type drain region 444 by the deep trench field insulation layer 470. Thus, the deep trench field insulation layer 470 may suppress a field crowding phenomenon occurring at an edge of the gate electrode 454 which is adjacent to the N-type drain region 444, thereby improving a drain junction breakdown voltage characteristic and a gate dielectric breakdown voltage characteristic of the power integrated device 400.

Although FIG. 6 illustrates an example in which the deep trench field insulation layer 470 and the trench isolation layer 460 directly contact side edges of the N-type drain region 444, the embodiment is not limiting. For example, in another embodiment, at least one of the deep trench field insulation layer 470 and the trench isolation layer 460 may be disposed spaced apart from the N-type drain region 444. The trench isolation layer 460 may be disposed at one side of the N-type drain region 444, and the deep trench field insulation layer 470 may be disposed at the other side of the N-type drain region 444. The deep trench field insulation layer 470 may overlap an edge of the gate insulation layer 452 and an edge of the gate electrode 454. In another embodiment, the deep trench field insulation layer 470 may be spaced apart from the gate insulation layer 452 and the gate electrode 454.

As described above, the N-type drift region 430 may be shallower than the deep trench field insulation layer 470 and the N-type well region 412. Thus, a junction breakdown voltage of the N-type well region 412 may increase. Under this structure, when electrons emitted from the N-type source region 442 drift toward the N-type drain region 444 through the channel region 424, the N-type well region 412, and the N-type drift region 430, the on-resistance characteristic of the power integrated device 400 may be degraded due to the low impurity concentration of the N-type well region 412.

However, an N-type impurity region 490 may be disposed to surround both sidewalls and a bottom surface of the deep trench field insulation layer 470. The N-type impurity region 490 may have an impurity concentration which is higher than an impurity concentration of the N-type well region 412. In an embodiment, the N-type impurity region 490 may have an impurity concentration which is substantially equal to an impurity concentration of the N-type drift region 430.

Thus, the N-type impurity region 490 may compensate for degradation of the on-resistance characteristic of the power integrated device 400.

As described with reference to FIG. 2B, a first height and a second height of two opposing sidewalls of the deep trench field insulation layer 470 may be greater than a width of a bottom surface of the deep trench field insulation layer 470. The width is measured along the first direction. In another embodiment, the first and second heights of the deep trench field insulation layer 470 may be at least 1.2 times greater than the width of the deep trench field insulation layer 470. The height, that is, the depth, of the deep trench field insulation layer 470 may be greater than the height, that is, the depth, of the general shallow trench field insulation layer 170' shown in FIG. 2A, and the width of the deep trench field insulation layer 470 in the first direction may be shorter than the width of the general shallow trench field insulation layer 170' shown in FIG. 2A. A total sum of the first height, the second height, and the width of the deep trench field insulation layer 470 may be equal to a total sum of the first height L11, the second height L12 and the width L13 of the general shallow trench field insulation layer 170' shown in FIG. 2A.

When the P-type body contact region 422 and the N-type source region 442 are grounded and a drain voltage and a gate voltage, for example, a gate voltage over a threshold voltage, are respectively applied to the N-type drain region 444 and the gate electrode 454, an inversion layer may be formed in the channel region 424 and a drain current may flow through the inversion layer. That is, electrons emitted from the N-type source region 442 may drift toward the N-type drain region 444 through the channel region 424, that is, the inversion layer, the N-type well region 412 or a first drift region, and the N-type drift region 430 or a second drift region due to an electric field, which is created between the N-type source region 442 and the N-type drain region 444, along a current path indicated by a dotted line 480. When the electrons emitted from the N-type source region 442 drift toward the N-type drain region 444, the electrons may move along the sidewalls and a bottom surface of the deep trench field insulation layer 470.

A drift length of the electrons in the power integrated device 400 may correspond to a sum of the first height, the second height, and the width of the deep trench field insulation layer 470. The drift length of the electrons in the power integrated device 400 may be substantially equal to a sum of the first height L11, the second height L12 and the width L13 of the general shallow trench field insulation layer 170' illustrated in FIG. 2A. Thus, the power integrated device 400 may exhibit substantially the same drain junction breakdown voltage as the general power integrated device 10 illustrated in FIG. 2A.

As described with reference to FIG. 3, a pitch of the power integrated device 400 measured along the first direction may be shorter than the pitch P1 of the general power integrated device 10 illustrated in FIG. 3. Thus, the on-resistance characteristic of the power integrated device 400 may be improved as compared with the general power integrated device 10. That is, according to the present embodiment, the on-resistance characteristic of the power integrated device 400 may be improved without any degradation of the drain junction breakdown voltage characteristic. This advantage of the power integrated device 400 may be more effectively observed when a plurality of power integrated devices 400 is integrated in a single substrate.

Figure 7:
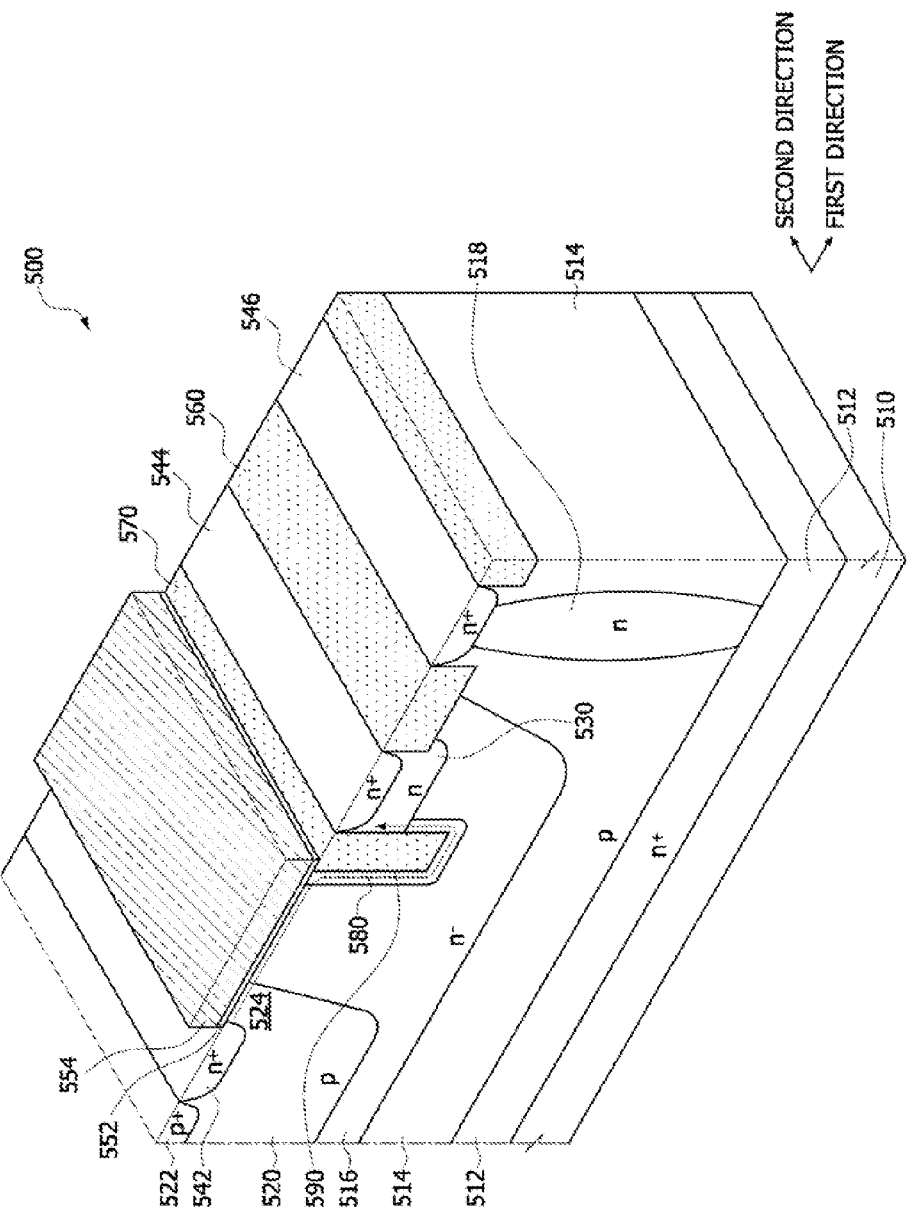
FIG. 7 is a perspective view illustrating a power integrated device according to still yet another embodiment.

FIG. 7 is a perspective view illustrating a power integrated device 500 according to still yet another embodiment.

Referring to FIG. 7, the power integrated device 500 may be configured to include a buried layer 512, for example, a buried bond layer. The buried layer 512 may be disposed between a substrate 510 and an active layer in which an LDMOS transistor is formed. The buried layer 512 may prevent the substrate 510 from influencing operation of the LDMOS transistor formed in the active layer. A N-type sink region 518 may penetrate a portion of the active layer and contact the buried layer 512. A N-type contact region 546 may be disposed on the N-type sink region 518. Thus, if the LDMOS transistor is formed in the active layer surrounded by the N-type sink region 518 and the buried layer 512, the N-type sink region 518 and the buried layer 512 may isolate the LDMOS transistor from other devices integrated on the substrate 510. A ground voltage may be applied to the N-type sink region 518 and the buried layer 512 through the N-type contact region 546.

The buried layer 512 and the active layer 514, for example, a P-type epitaxial layer 514, may be sequentially stacked on the substrate 510. A N-type well region 516 may be disposed in an upper region of the P-type epitaxial layer 514. The N-type well region 516 may serve as a first drift region. A P-type body region 520 and an N-type drift region 530 may be spaced apart from each other and provided in an upper region of the N-type well region 516. The P-type body region 520 and the N-type drift region 530 may be arrayed in a first direction. The N-type drift region 530 may serve as a second drift region.

The N-type well region 516 may have an impurity concentration which is lower than the impurity concentrations of the N-type drift regions 130, 230 and 330 shown in FIGS. 1, 4, and 5 and may correspond to a drain bulk region of the power integrated device 500. Thus, a width of a depletion region, which is created in the N-type well region 516 when a reverse bias, that is, a drain voltage, is applied between the P-type body region 520 and the N-type well region 516, may be greater than widths of depletion regions, which is created in the N-type drift regions 130, 230 and 330 when the drain voltages are applied to the power integrated devices 100, 200 and 300 respectively shown in FIGS. 1, 4, and 5. As a result, the power integrated device 500 including the N-type well region 512 may exhibit an improved drain junction breakdown voltage characteristic as compared with the power integrated devices 100, 200 and 300. The N-type drift region 530 may have an impurity concentration which is higher than an impurity concentration of the N-type well region 516. That is, the N-type drift region 530 may have conductivity which is higher than the conductivity of the N-type well region 516. Accordingly, the N-type drift region 530 may compensate for degradation of an on-resistance characteristic of the power integrated device 500.

The P-type body region 520 may be formed by selectively diffusing P-type impurities into a portion of the N-type well region 516, and the N-type drift region 530 may be formed by selectively diffusing N-type impurities into another portion of the N-type well region 516.

A P-type body contact region 522 and an N-type source region 542 may be disposed in an upper region of the P-type body region 520. The P-type body contact region 522 and the N-type source region 542 may be disposed to have stripe shapes that extend in a second direction crossing the first direction. The P-type body contact region 522 and the N-type source region 542 may be exposed to a top surface of the P-type body region 520. An upper region of the P-type body region 520 between the N-type source region 542 and the N-type well region 516 may serve as a channel region 524 in which an inversion layer is formed under a certain condition.

The P-type body contact region 522 and the N-type source region 542 may have impurity concentrations which are higher than an impurity concentration of the P-type body region 520. The P-type body contact region 522 and the N-type source region 542 may be biased to have the same electric potential. For example, the P-type body contact region 522 and the N-type source region 542 may be connected to a ground line. An N-type drain region 544 may be disposed in an upper region of the N-type drift region 530. The N-type drain region 544 may have an impurity concentration which is higher than that of the N-type drift region 530. The N-type drain region 544 may be disposed to have a stripe shape extending in the second direction. A gate insulation layer 552 and a gate electrode 554 may be sequentially stacked on the channel region 524. The gate insulation layer 552 and the gate electrode 554 may further extend onto the N-type well region 516. The gate insulation layer 552 and the gate electrode 554 may also be disposed to have stripe shapes extending in the second direction.

A trench isolation layer 560 and a deep trench field insulation layer 570 may be disposed in an upper region of the N-type well region 516. The trench isolation layer 560 and the deep trench field insulation layer 570 may be exposed to a top surface of the N-type well region 516. Whereas the depth of the trench isolation layer 560 may be shallower than the depth of the N-type drift region 530, the depth of the deep trench field insulation layer 570 may be greater than the depth of the N-type drift region 530. Thus, the bottom surface of the deep trench field insulation layer 570 may be located at a lower level than the bottom surface of the N-type drift region 530, and the bottom surface of the trench isolation layer 560 may be located at an upper level than the bottom surface of the N-type drift region 530.

The trench isolation layer 560 may be disposed at one side of the N-type drain region 544 and have a stripe shape which is in parallel to the N-type drain region 544. The trench isolation layer 560 may physically and electrically isolate the power integrated device 500 from other devices. The deep trench field insulation layer 570 may be disposed at the other side of the N-type drain region 544. The deep trench field insulation layer 570 may also extend in the second direction and have a stripe shape which is parallel to the N-type drain region 544.

As illustrated in FIG. 7, the deep trench field insulation layer 570 may be disposed in the N-type well region 516 between the P-type body region 520 and the N-type drain region 544. The gate electrode 554 may be spaced apart from the N-type drain region 544 by the deep trench field insulation layer 570. Thus, the deep trench field insulation layer 570 may suppress a field crowding phenomenon occurring at an edge of the gate electrode 554 which is adjacent to the N-type drain region 544, thereby improving a drain junction breakdown voltage characteristic and a gate dielectric breakdown voltage characteristic of the power integrated device 500.

Although FIG. 7 illustrates an example in which the deep trench field insulation layer 570 and the trench isolation layer 560 directly contact both edges of the N-type drain region 544, the embodiment is not limiting. For example, in another embodiment, at least one of the deep trench field insulation layer 570 and the trench isolation layer 560 may be spaced apart from the N-type drain region 544. The trench isolation layer 560 may be disposed at one side of the N-type drain region 544, and the deep trench field insulation layer 570 may be disposed at the other side of the N-type drain region 544.

The deep trench field insulation layer 570 may be disposed to overlap with an edge of the gate insulation layer 552 and an edge of the gate electrode 554. In another embodiment, the deep trench field insulation layer 570 may be spaced apart from the gate insulation layer 552 and the gate electrode 554.

As described above, the N-type drift region 530 may be shallower than the deep trench field insulation layer 570 and the N-type well region 516. Therefore, a junction breakdown voltage of the N-type well region 516 may increase. Thus, when electrons emitted from the N-type source region 542 drift toward the N-type drain region 544 through the channel region 524, the N-type well region 516, and the N-type drift region 530, the on-resistance characteristic of the power integrated device 500 may be degraded due to the low impurity concentration of the N-type well region 516.

However, according to an embodiment, an N-type impurity region 590 may surround both sidewalls and a bottom surface of the deep trench field insulation layer 570. The N-type impurity region 590 may have an impurity concentration which is higher than an impurity concentration of the N-type well region 516. In an embodiment, the N-type impurity region 590 may have an impurity concentration which is substantially equal to an impurity concentration of the N-type drift region 530. Thus, the N-type impurity region 590 may compensate for degradation of the on-resistance characteristic of the power integrated device 500.

Similar to the structure shown in FIG. 2B, each of the first height and the second height of two opposing sidewalls of the deep trench field insulation layer 570 may be greater than the width of the bottom surface of the deep trench field insulation layer 570. In another embodiment, each of the first and second heights of the deep trench field insulation layer 570 may be at least 1.2 times greater than the width of the deep trench field insulation layer 570. The height, that is, the depth, of the deep trench field insulation layer 570 may be greater than the height, that is, the depth, of the general shallow trench field insulation layer 170' shown in FIG. 2A, and the width of the deep trench field insulation layer 570, which is measured along the first direction, may be less than the width of the general shallow trench field insulation layer 170' shown in FIG. 2A. A total sum of the first height, the second height, and the width of the deep trench field insulation layer 570 may be equal to a total sum of the first height L11, the second height L12, and the width L13 of the general shallow trench field insulation layer 170' shown in FIG. 2A.

When the P-type body contact region 522 and the N-type source region 542 are grounded and a drain voltage and a gate voltage, for example, a gate voltage over a threshold voltage, are respectively applied to the N-type drain region 544 and the gate electrode 554, an inversion layer may be formed in the channel region 524 and a drain current may flow through the inversion layer. That is, electrons emitted from the N-type source region 542 may drift toward the N-type drain region 544 through the channel region 524, that is, the inversion layer, the N-type well region 516, that is, the first drift region, and the N-type drift region 530, that is, the second drift region, by an electric field, which is created between the N-type source region 542 and the N-type drain region 544, along a current path indicated by a dotted line 580. While the electrons emitted from the N-type source region 542 drift toward the N-type drain region 544, the electrons may move along the sidewalls and the bottom surface of the deep trench field insulation layer 570.

A drift length of the electrons in the power integrated device 500 may correspond to a sum of the first height, the second height, and the width of the deep trench field insulation layer 570. The drift length of the electrons in the power integrated device 500 may be substantially equal to a sum of the first height L11, the second height L12, and the width L13 of the general shallow trench field insulation layer 170' illustrated in FIG. 2A. Thus, the power integrated device 500 may exhibit substantially the same drain junction breakdown voltage as the general power integrated device 10 illustrated in FIGS. 2A and 3.

As described with reference to FIG. 3, a pitch of the power integrated device 500, which is measured along the first direction, may be shorter than the pitch P1 of the general power integrated device 10 illustrated in FIG. 3. Thus, the on-resistance characteristic of the power integrated device 500 may be improved as compared with the general power integrated device 10. That is, according to an embodiment, the on-resistance characteristic of the power integrated device 500 may be improved without any degradation of the drain junction breakdown voltage characteristic. This advantage of the power integrated device 500 may be more effectively observed when a plurality of power integrated devices 500 is integrated in a single substrate.

Figure 8:
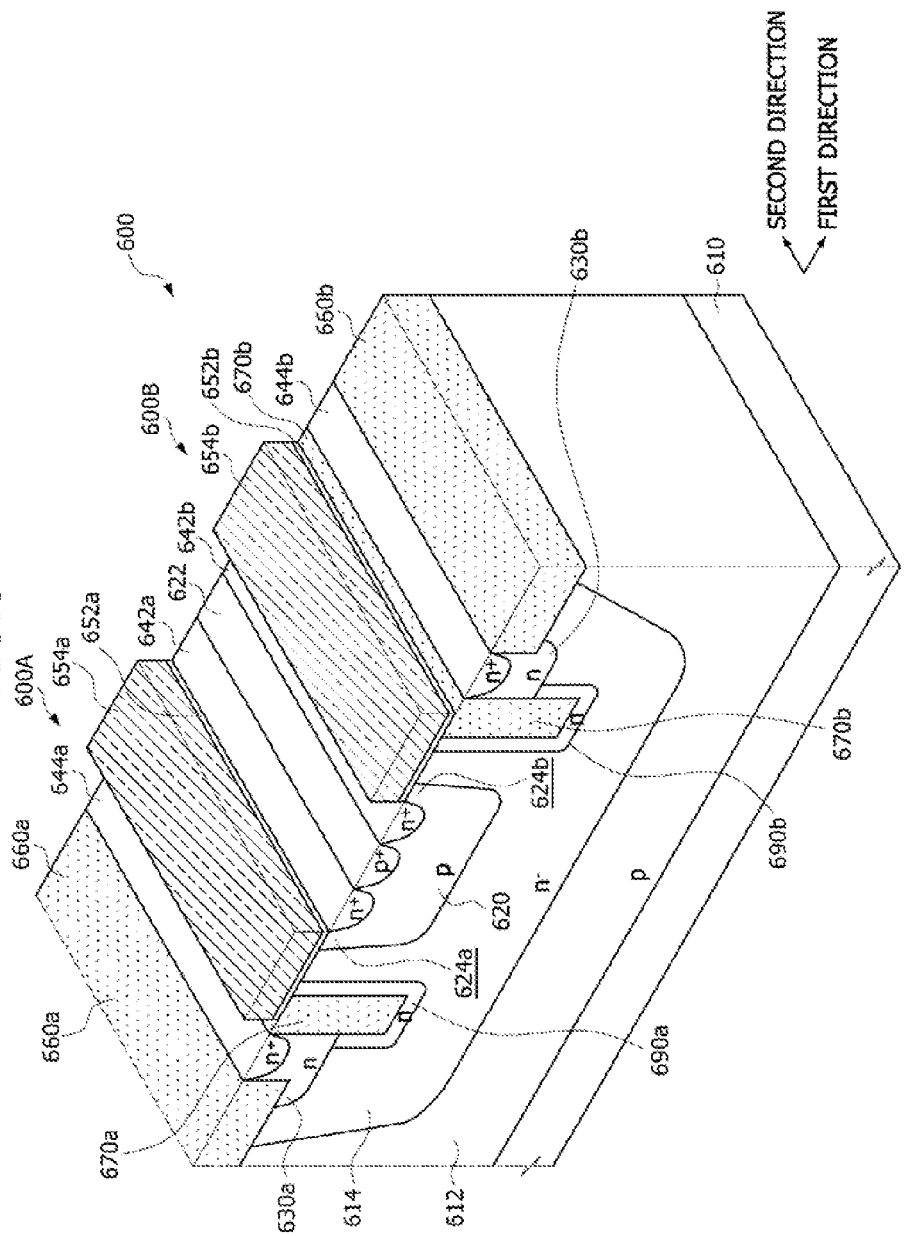
FIG. 8 is a perspective view illustrating a power integrated device according to a further embodiment.

FIG. 8 is a perspective view illustrating a power integrated device 600 according to a further embodiment. Referring to FIG. 8, the power integrated device 600 may include a first LDMOS transistor 600A and a second LDMOS transistor 600B that share a common source region. That is, the first and second LDMOS transistors 600A and 600B may be electrically connected in series such that a source terminal of the first LDMOS transistor 600A is electrically connected to a source of the second LDMOS transistor 600B.

Specifically, a P-type semiconductor layer 612 may be disposed on a substrate 610. In an embodiment, the P-type semiconductor layer 612 may be a single crystalline silicon epitaxial layer doped with P-type impurities. Alternatively, the P-type semiconductor layer 612 may be a P-type well region that is formed by implanting and diffusing P-type impurities into an upper region of the substrate 610. If the substrate 610 is a single crystalline silicon substrate doped with P-type impurities, the P-type semiconductor layer 612 may be omitted. An N-type well region 614 may be disposed in an upper region of the P-type semiconductor layer 612 such that sidewalls and a bottom surface of the N-type well region 614 are surrounded by the P-type semiconductor layer 612.

A P-type body region 620, a first N-type drift region 630*a*, and a second N-type drift region 630*b* may be disposed in an upper region of the N-type well region 614. The P-type body region 620 may be disposed between the first and second N-type drift regions 630*a* and 630*b* and may be spaced apart from the first and second N-type drift regions 630*a* and 630*b*. The first LDMOS transistor 600A may share the P-type body region 620 with the second LDMOS transistor 600B. The first N-type drift region 630*a* may be included in the first LDMOS transistor 600A, and the second N-type drift region 630*b* may be included in the second LDMOS transistor 600B. Each of the first and second N-type drift regions 630*a* and 630*b* may have an impurity concentration which is higher than an impurity concentration of the N-type well region 614. The first and second N-type drift regions 630*a* and 630*b* may be doped with the same impurity ions using an ion implantation process and a diffusion process. That is, the first and second N-type drift regions 630*a* and 630*b* may be simultaneously formed using a single step implantation process and a single step diffusion process. Thus, the first and second N-type drift regions 630*a* and 630*b* may have substantially the same impurity concentration.

A P-type body contact region 622, a first N-type source region 642*a*, and a second N-type source region 642*b* may be arrayed in a first direction and disposed in an upper region of the P-type body region 620. The P-type body contact region 622 may be disposed to have a stripe shape extending in a second direction crossing the first direction. The first N-type source region 642*a* may contact one side of the P-type body contact region 622 and have a stripe shape extending in the second direction. The second N-type source region 642*a* may contact the other side of the P-type body contact region 622 and have a stripe shape extending in the second direction.

An upper region of the P-type body region 620 between the first N-type source region 642*a* and the N-type well region 614 may serve as a channel region 624*a* of the first LDMOS transistor 600A in which an inversion layer is formed under a certain condition. An upper region of the P-type body region 620 between the second N-type source region 642*b* and the N-type well region 614 may serve as a channel region 624*b* of the second LDMOS transistor 600B in which an inversion layer is formed under a certain condition.

The P-type body contact region 622, the first N-type source region 642*a*, and the second N-type source region 642*b* may be biased to have the same electric potential. Thus, the first and second N-type source regions 642*a* and 642*b* may constitute a common source region of the first and second LDMOS transistors 600A and 600B. In an embodiment, the P-type body contact region 622 and the first and second N-type source regions 642*a* and 642*b* may be connected to a ground line.

A first N-type drain region 644*a* may be disposed in an upper region of the first N-type drift region 630*a*. The first N-type drain region 644*a* may have an impurity concentration which is higher than that of the first N-type drift region 630*a*. The first N-type drain region 644*a* may be disposed to have a stripe shape extending in the second direction. A second N-type drain region 644*b* may be disposed in an upper region of the second N-type drift region 630*b*. The second N-type drain region 644*b* may have an impurity concentration which is higher than that of the second N-type drift region 630*b*. The second N-type drain region 644*b* may be disposed to have a stripe shape extending in the second direction. The first N-type drain region 644*a* may function as a drain region of the first LDMOS transistor 600A, and the second N-type drain region 644*b* may function as a drain region of the second LDMOS transistor 600B.

A first gate insulation layer 652*a* and a first gate electrode 654*a* may be sequentially stacked on the channel region 624*a*. The first gate insulation layer 652*a* and the first gate electrode 654*a* may function as a gate insulation layer and a gate electrode of the first LDMOS transistor 600A, respectively. The first gate insulation layer 652*a* and the first gate electrode 654*a* may extend in the second direction to have stripe shapes. The first gate insulation layer 652*a* and the first gate electrode 654*a* may further extend onto the N-type well region 614 adjacent to the channel region 624*a*. A second gate insulation layer 652*b* and a second gate electrode 654*b* may be sequentially stacked on the channel region 624*b*. The second gate insulation layer 652*b* and the second gate electrode 654*b* may function as a gate insulation layer and a gate electrode of the second LDMOS transistor 600B, respectively. The second gate insulation layer 652b and the second gate electrode 654b may extend in the second direction to have stripe shapes. The second gate insulation layer 652b and the second gate electrode 654b may further extend onto the N-type well region 614 adjacent to the channel region 624b.

A first trench isolation layer 660a may be disposed in an upper region of the N-type well region 614 adjacent to one side of the first N-type drain region 644a. A first deep trench field insulation layer 670a may be disposed in an upper region of the N-type well region 614 adjacent to the other side of the first N-type drain region 644a. A second trench isolation layer 660b may be disposed in an upper region of the N-type well region 614 adjacent to one side of the second N-type drain region 644b. A second deep trench field insulation layer 670b may be disposed in an upper region of the N-type well region 614 adjacent to the other side of the second N-type drain region 644b. In an embodiment, the first trench isolation layer 660a may have the same width and depth as the second trench isolation layer 660b.

The depth of the first trench isolation layer 660a may be shallower than the depth of the first N-type drift region 630a, the depth of the first deep trench field insulation layer 670a may be greater than the depth of the first N-type drift region 630a. Thus, the bottom surface of the first deep trench field insulation layer 670a may be located at a lower level than the bottom surface of the first N-type drift region 630a. The bottom surface of the first trench isolation layer 660a may be located at an upper level than the bottom surface of the first N-type drift region 630a. The depth of the second trench isolation layer 660b may be shorter than the depth of the second N-type drift region 630b, but the depth of the second deep trench field insulation layer 670b may be greater than the depth of the second N-type drift region 630b. Thus, the bottom surface of the second deep trench field insulation layer 670b may be located at a lower level than the bottom surface of the second N-type drift region 630b. The bottom surface of the second trench isolation layer 660b may be located at an upper level than the bottom surface of the second N-type drift region 630b.

The first trench isolation layer 660a may be disposed at one side of the first N-type drain region 644a and have a stripe shape which is parallel to the first N-type drain region 644a. The first deep trench field insulation layer 670a may be disposed at the other side of the first N-type drain region 644a. The first deep trench field insulation layer 670a may further extend in the second direction and have a stripe shape which is parallel to the first N-type drain region 644a.

The second trench isolation layer 660b may be disposed at one side of the second N-type drain region 644b and have a stripe shape which is parallel to the second N-type drain region 644b. The second deep trench field insulation layer 670b may be disposed at the other side of the second N-type drain region 644b. The second deep trench field insulation layer 670b may further extend in the second direction and have a stripe shape which is parallel to the second N-type drain region 644b. The first and second trench isolation layers 660a and 660b may physically and electrically isolate the power integrated device 600 from other devices.

As illustrated in FIG. 8, the first deep trench field insulation layer 670a may be disposed in the N-type well region 614 between the P-type body region 620 and the first N-type drain region 644a, and the first gate electrode 654a may be spaced apart from the first N-type drain region 644a by the first deep trench field insulation layer 670a. Thus, the first deep trench field insulation layer 670a may suppress a field crowding phenomenon from occurring at an edge of the first gate electrode 654a which is adjacent to the first N-type drain region 644a, thereby improving a drain junction breakdown voltage characteristic and a gate dielectric breakdown voltage characteristic of the first LDMOS transistor 600A.

Similarly, the second deep trench field insulation layer 670b may be disposed in the N-type well region 614 between the P-type body region 620 and the second N-type drain region 644b, and the second gate electrode 654b may be spaced apart from the second N-type drain region 644b by the second deep trench field insulation layer 670b. Thus, the second deep trench field insulation layer 670b may suppress a field crowding phenomenon from occurring at an edge of the second gate electrode 654b which is adjacent to the second N-type drain region 644b, thereby improving a drain junction breakdown voltage characteristic and a gate dielectric breakdown voltage characteristic of the second LDMOS transistor 600B.

Although FIG. 8 illustrates an example in which the first deep trench field insulation layer 670a and the first trench isolation layer 660a directly contact side edges of the first N-type drain region 644a, and the second deep trench field insulation layer 670b and the second trench isolation layer 660b directly contact side edges of the second N-type drain region 644b, the embodiment is not limiting. For example, in another embodiment, at least one of the first deep trench field insulation layer 670a and the first trench isolation layer 660a may be spaced apart from the first N-type drain region 644a and at least one of the second deep trench field insulation layer 670b and the second trench isolation layer 660b may be spaced apart from the second N-type drain region 644b.

The first trench isolation layer 660a may be disposed at one side of the first N-type drain region 644a, and the first deep trench field insulation layer 670a may be disposed at the other side of the first N-type drain region 644a. The second trench isolation layer 660b may be disposed at one side of the second N-type drain region 644b, and the second deep trench field insulation layer 670b may be disposed at the other side of the second N-type drain region 644b.

The first deep trench field insulation layer 670a may be disposed to overlap with an edge of the first gate insulation layer 652a and an edge of the first gate electrode 654a. In another embodiment, the first deep trench field insulation layer 670a may be spaced apart from the first gate insulation layer 652a and the first gate electrode 654a.

The second deep trench field insulation layer 670b may overlap with an edge of the second gate insulation layer 652b and an edge of the second gate electrode 654b. In another embodiment, the second deep trench field insulation layer 670b may be spaced apart from the second gate insulation layer 652b and the second gate electrode 654b.

As described above, the first and second N-type drift regions 630a and 630b may be shallower than the first and second deep trench field insulation layers 670a and 670b and the N-type well region 614. Therefore, a junction breakdown voltage of the N-type well region 614 may increase. Thus, when electrons emitted from the first N-type source region 642a drift toward the first N-type drain region 644a through the N-type well region 614 and the first N-type drift region 630a and electrons emitted from the second N-type source region 642b adrift toward the second N-type drain region 644b through the N-type well region 614 and the second N-type drift region 630b, the on-resistance characteristic of the power integrated device 600 may be degraded due to the low impurity concentration of the N-type well region 614.

However, according to an embodiment, a first N-type impurity region 690a may surround both sidewalls and a bottom surface of the first deep trench field insulation layer 670a, and a second N-type impurity region 690b may surround both sidewalls and a bottom surface of the second deep trench field insulation layer 670b. Each of the first and second N-type impurity regions 690a and 690b may have an impurity concentration which is higher than an impurity concentration of the N-type well region 614. In an embodiment, the first and second N-type impurity regions 690a and 690b may have the impurity concentrations which are substantially equal to the impurity concentrations of the first and second N-type drift regions 630a and 630b, respectively. Thus, the first and second N-type impurity regions 690a and 690b may compensate for degradation of the on-resistance characteristic of the power integrated device 600.

Similar to what is shown in FIG. 2B, a first height and a second height of two opposing sidewalls of the first deep trench field insulation layer 670a may be greater than a width of a bottom surface of the first deep trench field insulation layer 670a, and a first height and a second height of two opposing sidewalls of the second deep trench field insulation layer 670b may be greater than a width of a bottom surface of the second deep trench field insulation layer 670b. In an embodiment, the first and second heights of each of the first and second deep trench field insulation layers 670a and 670b may be at least 1.2 times greater than the width of each of the first and second deep trench field insulation layers 670a and 670b.

The heights, that is, the depths, of the first and second deep trench field insulation layers 670a and 670b may be greater than the height, that is, the depth, of the general shallow trench field insulation layer 170' shown in FIG. 2A, and the widths of the first and second deep trench field insulation layers 670a and 670b, which are measured along the first direction, may be shorter than the width of the general shallow trench field insulation layer 170' shown in FIG. 2A. A total sum of the first height, the second height, and the width of each of the first and second deep trench field insulation layers 670a and 670b may be equal to a total sum of the first height L11, the second height L12, and the width L13 of the general shallow trench field insulation layer 170' shown in FIG. 2A.

When the P-type body contact region 622 and the first and second N-type source regions 642a and 642b are grounded and a drain voltage and a gate voltage, for example, a gate voltage over a threshold voltage, are respectively applied to the first and second N-type drain regions 644a and 644b and the first and second gate electrodes 654a and 654b, an inversion layer may be formed in each of the channel regions 624a and 624b and drain currents may flow through the inversion layers. That is, electrons emitted from the first N-type source region 642a may drift toward the first N-type drain region 644a through the channel region 624a, that is, the inversion layer, the N-type well region 614, and the first N-type drift region 630a due to an electric field which is created between the first N-type source region 642a and the first N-type drain region 644a.

Similarly, electrons emitted from the second N-type source region 642b may drift toward the second N-type drain region 644b through the channel region 624b, that is, the inversion layer, the N-type well region 614, and the second N-type drift region 630b by an electric field which is created between the second N-type source region 642b and the second N-type drain region 644b. When the electrons emitted from the first and second N-type source regions 642a and 642b drift toward the first and second N-type drain regions 644a and 644b, the electrons may move along the sidewalls and bottom surfaces of the first and second deep trench field insulation layers 670a and 670b.

A drift length of the electrons in the first LDMOS transistor 600A may correspond to a sum of the first height, the second height, and the width of the first deep trench field insulation layer 670a. A drift length of the electrons in the second LDMOS transistor 600B may correspond to a sum of the first height, the second height, and the width of the second deep trench field insulation layer 670b. The drift length of each of the first and second LDMOS transistors 600A and 600B may be substantially equal to a sum of the first height L11, the second height L12, and the width L13 of the general shallow trench field insulation layer 170' illustrated in FIG. 2A. Thus, the power integrated device 600 may exhibit substantially the same drain junction breakdown voltage as the general power integrated device 10 illustrated in FIG. 2A.

Similar to what is shown in FIG. 3, a pitch of each of the first and second LDMOS transistors 600A and 600B in the first direction may be shorter than the pitch P1 of the general power integrated device 10 illustrated in FIG. 3. Thus, the on-resistance characteristic of the power integrated device 600 may be improved as compared with the general power integrated device 10. That is, according to an embodiment, the on-resistance characteristic of the power integrated device 600 may be improved without any degradation of the drain junction breakdown voltage characteristic. This advantage of the power integrated device 600 may be more effectively observed when a plurality of power integrated devices 600 is integrated in a single substrate.

Figure 9:
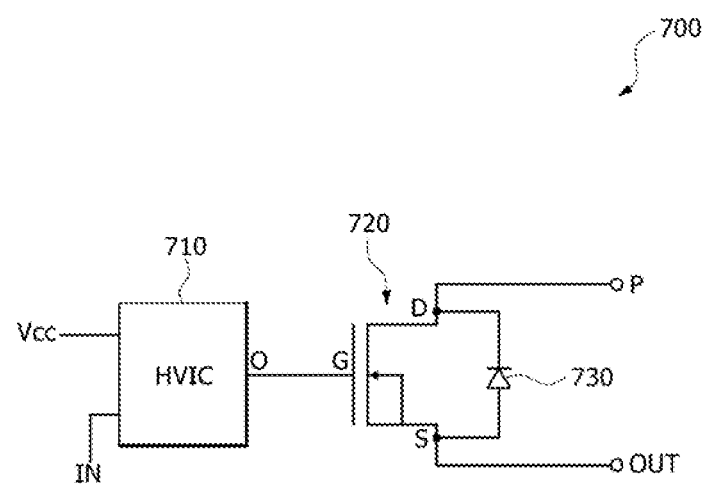
FIG. 9 is a schematic view illustrating an electronic device employing a power integrated devices according to an embodiment.

FIG. 9 is a schematic view illustrating an electronic device 700 employing a power integrated device 720 according to an embodiment. Referring to FIG. 9, the electronic device 700 may include a high-voltage integrated circuit (HVIC) 710 serving as a driver circuit and the power integrated device 720 serving as a switching device. This electronic device 700 may form a single phase inverter. The HVIC 710 may have a supply voltage terminal VCC, an input terminal IN, and an output terminal O. The HVIC 710 may receive a power supply voltage signal through the supply voltage terminal VCC to drive internal circuits thereof. In addition, the HVIC 710 may receive an input signal through the input terminal IN to generate an output signal. The output signal may be outputted through the output terminal O. The output terminal O may be connected to a gate terminal G of the power integrated device 720.

The power integrated device 720 may include any LDMOS transistor as shown in FIGS. 1 to 8. Thus, the power integrated device 720 may include a deep trench field insulation layer having a depth which is greater than the width. As described with reference to FIG. 2B, a drift length along the sidewalls and the bottom surface of the deep trench field insulation layer employed in the power integrated device 720 may be substantially equal to a drift length along the sidewalls and the bottom surface of the shallow trench field insulation layer 170' employed in the general power integrated device. Thus, the power integrated device 720 may exhibit substantially the same drain junction breakdown voltage characteristic as the general power integrated device.

The pitch size of the power integrated device 720 in a direction from a source region toward a drain region may be reduced to be shorter than the pitch size P1 shown in FIG. 3 of the general power integrated device 10 shown in FIG. 3. This is due to the width of the deep trench field insulation layer employed in the power integrated device 720 being smaller than the width of the shallow trench field insulation layer 170' employed in the general power integrated device 10. Thus, the power integrated device 720 may exhibit an improved on-resistance characteristic as compared with the general power integrated device 10.

The power integrated device 720 may include a drain terminal D connected to a power supply terminal P to which a power supply voltage is applied. Moreover, the power integrated device 720 may include a source terminal S connected to an output terminal OUT. A freewheeling diode 730 may be coupled between the drain terminal D and the source terminal S of the power integrated device 720. The output signal of the HVIC 710 may be applied to the gate terminal G of the power integrated device 720 to turn on or turn off the power integrated device 720. If the electronic device 700 is a multi-phase inverter, the electronic device 700 may be configured to include a plurality of HVICs 710 and a plurality of power integrated devices 720. Thus the number of the HVICs 710 and the number of the power integrated devices 720 may be equal to the number of the phases.

Figure 10:
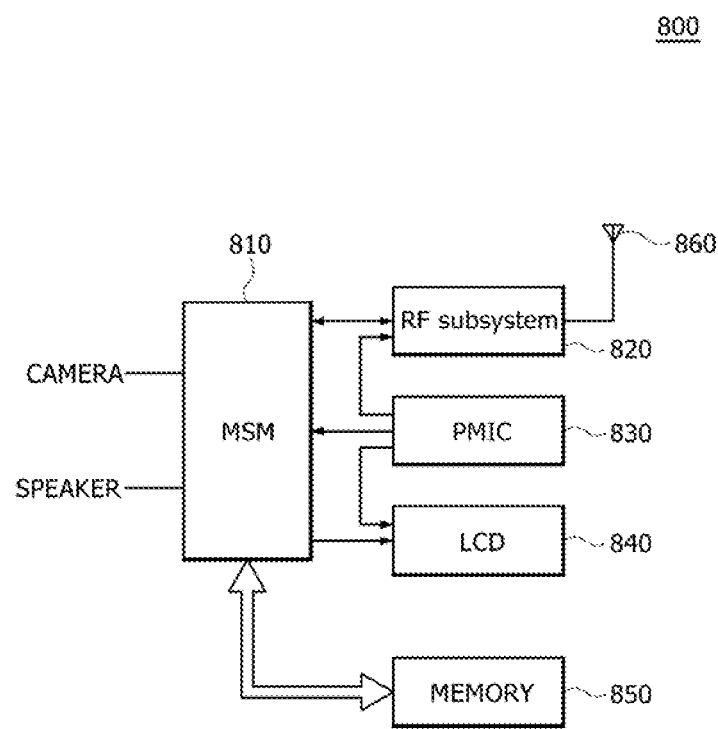
FIG. 10 is a block diagram illustrating an electronic system employing a power integrated devices according to an embodiment.

FIG. 10 is a block diagram illustrating an electronic system 800 employing a power integrated device according to an embodiment. Referring to FIG. 10, the electronic system 800 may be a mobile system and may include a mobile station modem (MSM) 810, an radiofrequency (RF) subsystem 820, a power management integrated circuit (PMIC) 830, a display 840 such as a liquid crystal display (LCD), and a memory 850. The MSM 810 may include a processor for controlling overall operation of the electronic system 800, a digital signal processor (DSP) for processing audio signals and video signals, a modem for communication, and a driver. The RF subsystem 820 may be used to stably set a frequency band available for the electronic system 800 and may be used to convert an analog signal into a digital signal or vice versa. The display 840 may be used as an output unit of the electronic system 800. The memory 850 may include a mobile dynamic random access memory (DRAM) and a NAND flash memory that store data which are used in operation of the electronic system 800. The memory 850 may communicate with the MSM 810 through a bidirectional bus.

The electronic system 800 may further include a camera, a speaker, and an antenna 860. The camera and the speaker may be controlled by the MSM 810. Images captured by the camera may be stored in the memory 850, and image data stored in the memory 850 may be outputted through the display 840. The RF subsystem 820 may convert signals received through the antenna 860 into analog signals or digital signals. Audio signals received through the antenna 860 may be outputted through the speaker.

The PMIC 830 may receive power supply from an external device or a battery and transmit the power supply to various internal elements of the electronic system 800. Thus, the PMIC 830 may include power management circuit that employs a power integrated device according to an embodiment as a switching device. In an embodiment, the power management circuit may be configured to include a regulator, an inverter, a converter, or a driver.

Figure 11:
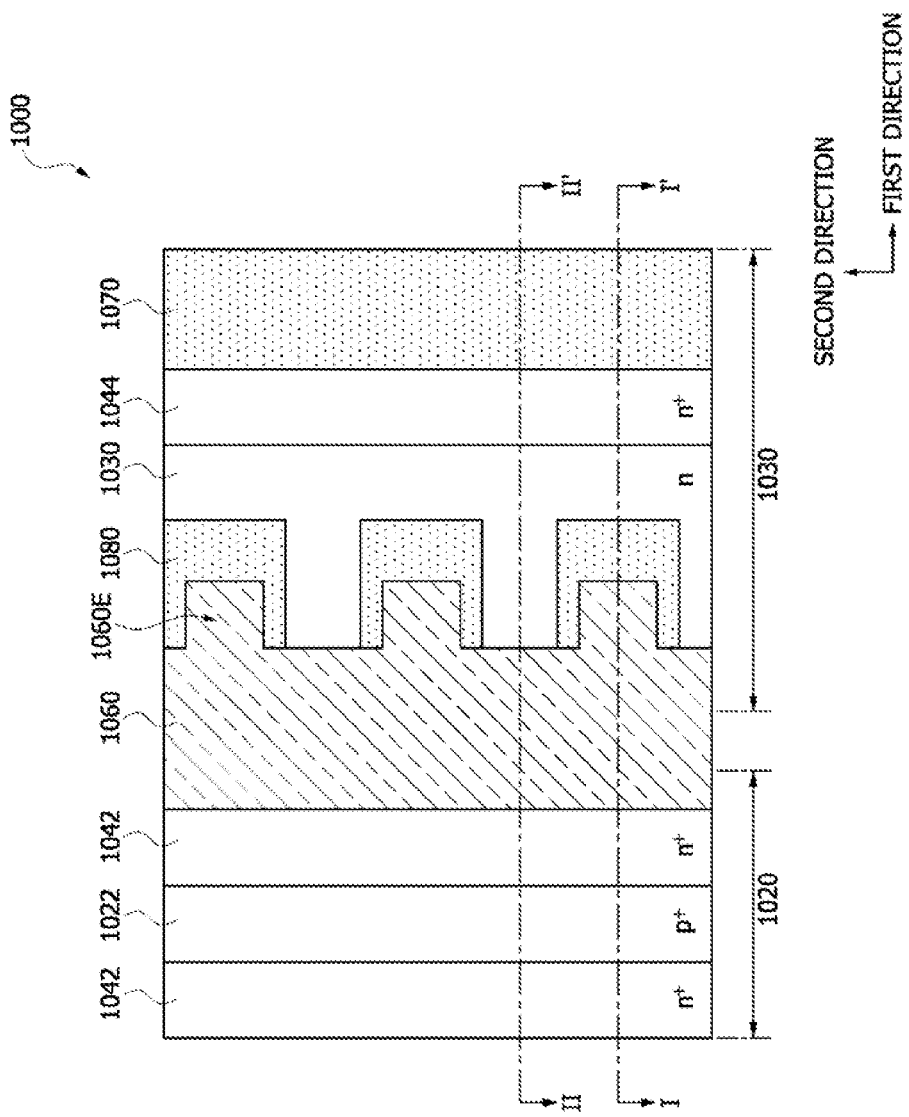
FIG. 11 is a layout diagram illustrating a power integrated device according to still yet another embodiment.
Figure 12:
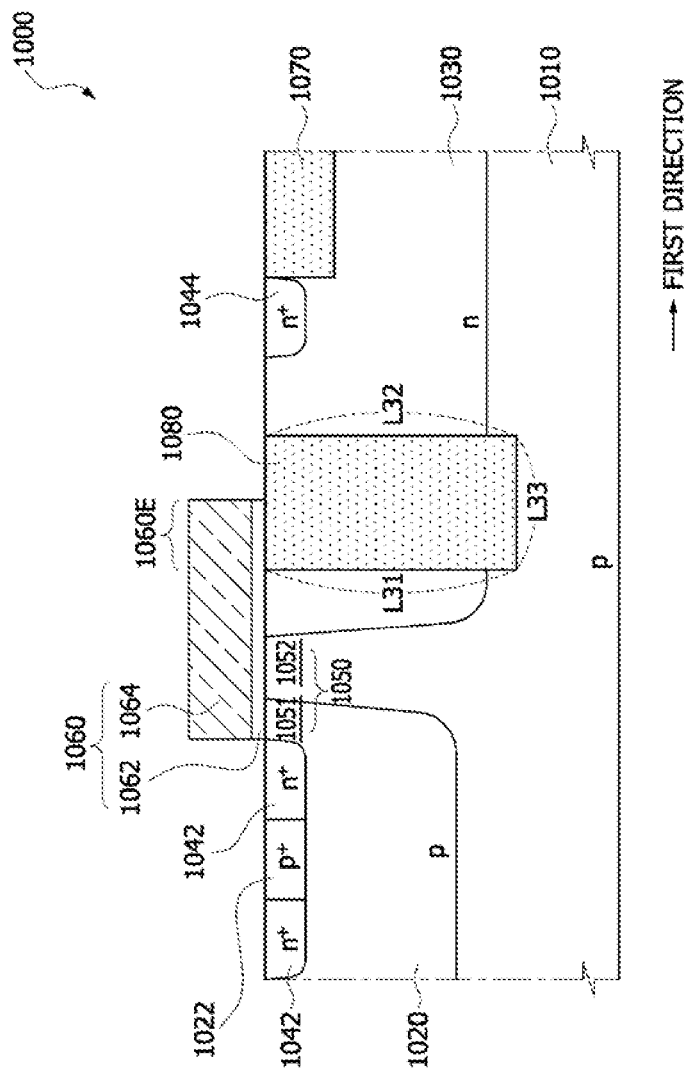
FIG. 12 is a cross-sectional view taken along a line I-I' of FIG. 11.
Figure 13:
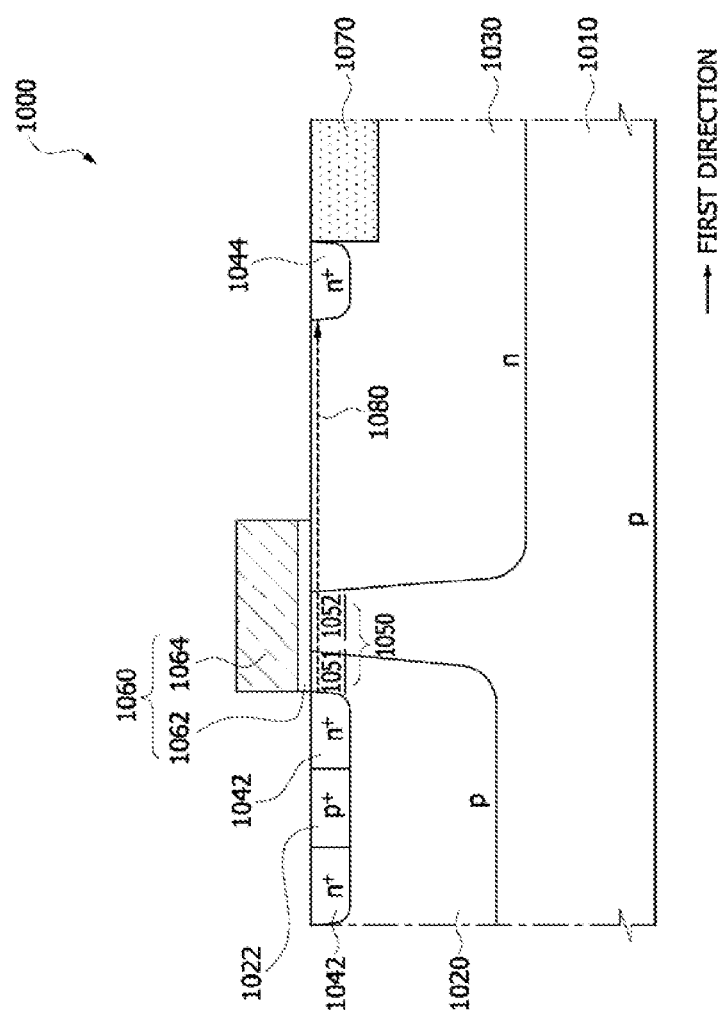
FIG. 13 is a cross-sectional view taken along a line II-II' of FIG. 11.

FIG. 11 is a layout diagram illustrating a power integrated device according to still yet another embodiment. FIG. 12 is a cross-sectional view taken along a line I-I' of FIG. 11. And FIG. 13 is a cross-sectional view taken along a line II-II' of FIG. 11. Referring to FIGS. 11-13, a p-type body region 1020 and an n-type drift region 1030 may be disposed in a p-type semiconductor layer 1010 to be spaced apart from each other in a first direction. In some embodiments, the p-type semiconductor layer 1010 may be replaced with a p-type well region. A p-type junction region formed in an upper portion of a semiconductor substrate may serve as the p-type well region. Alternatively, the p-type semiconductor layer 1010 may be a p-type epitaxial layer grown on a semiconductor substrate. In the present embodiment, the first direction may correspond to a channel length direction, that is, a direction along which carriers move or currents flow due to an electric field which is applied between a drain region and a source region. The p-type semiconductor layer 1010 between the P-type body region 1020 and the n-type drift region 1030 may correspond to a first channel region 1052. A p-type body contact region 1022 may be disposed in the p-type body region 1020. The p-type body contact region 1022 may extend in a second direction intersecting the first direction and have a stripe shape. In the present embodiment, the second direction may correspond to a channel width direction.

A couple of n-type source regions 1042 may be disposed at both sides of the p-type body contact region 1022, respectively. The couple of n-type source regions 1042 may be disposed to directly contact both sidewalls of the p-type body contact region 1022, respectively. The p-type body contact region 1022 and the n-type source regions 1042 may be coupled to a source terminal in common. An upper portion of the p-type body region 1020 between the first channel region 1052 and the n-type source regions 1042 may correspond to a second channel region 1051. The first and second channel regions 1052 and 1051 may constitute a channel region 1050 of the lateral power integrated device 1000. An n-type drain region 1044 may be disposed in an upper region of the n-type drift region 1030 opposite to the channel region 1050. The n-type drain region 1044 may extend in the second direction to have a stripe shape. The n-type drain region 1044 may be coupled to a drain terminal.

A gate insulation layer 1062 and a gate electrode 1064 may be sequentially stacked on the channel region 1050. The gate insulation layer 1062 and a gate electrode 1064 constitute a stacked gate 1060. The stacked gate 1060 may extend onto the n-type drift region 1030 between the p-type body region 1020 and the n-type drain region 1044. The stacked gate 1060 may be a stripe shape extending in the second direction. The gate electrode 1064 may be coupled to a gate terminal. The stacked gate 1060 may include a plurality of stacked gate extension portions 1060E each of which protrudes from a sidewall of the stacked gate 1060 in the first direction. The stacked gate extension portions 1060E may be spaced apart from each other in the second direction.

Trench isolation layers 1070 and a plurality of deep trench field insulation layers 1080 may be disposed in the n-type drift region 1030. The trench isolation layer 1070 and the deep trench field insulation layers 1080 may be exposed to a top surface of the n-type drift region 1030. The trench isolation layer 1070 may be disposed at one side of the n-type drain region 1044 to have a stripe shape which is parallel to the n-type drain region 1044. The trench isolation layer 1070 may physically and electrically isolate the power integrated device 1000 from other devices. Each of the deep trench field insulation layers 1080 may be disposed opposite to the trench isolation layer 1070 with respect to the n-type drain region 1044. Each of the deep trench field insulation layers 1080 may be spaced apart from the n-type drain region 1044 in the first direction. The deep trench field insulation layers 1080 may be spaced apart from each other in the second direction. The trench field insulation layers 1080 may overlap with the stacked gate extension portions 1060E, respectively.

The deep trench field insulation layers 1080 may have a first vertical length L31, that is, a first height at a first sidewall, a second vertical length L32, that is, a second height at a second sidewall, and a horizontal length L33, that is, a width measured along a bottom surface in the first direction. In an embodiment, the first height L31 and the second height L32 of the deep trench field insulation layers 1080 may be substantially equal to each other. The first and second heights L31 and L32 of the deep trench field insulation layers 1080 may be greater than the width L33 of the deep trench field insulation layers 1080. For example, the first and second heights L31 and 132 of the deep trench field insulation layers 1080 may be at least 1.2 times greater than the width L33 of the deep trench field insulation layers 1080. The deep trench field insulation layers 1080 may penetrate the n-type drift region 1030 and the bottom surface of the deep trench field insulation layers 1080 may be positioned in the p-type semiconductor layer 1010.

The deep trench field insulation layers 1080 may be disposed in the n-type drift region 1030 between the p-type body region 1020 and the n-type drain region 1044, and the stacked gate extension portion 1060E may be spaced apart from the n-type drain region 1044 by the deep trench field insulation layers 1080. Thus, the deep trench field insulation layers 1080 may suppress a field crowding phenomenon occurring at an edge of the stacked gate extension portion 1060E which is adjacent to the n-type drain region 1044, thereby improving a drain junction breakdown voltage characteristic and a gate dielectric breakdown voltage characteristic of the power integrated device 1000. An increase of the on-resistance value in the n-type drift region 1030 due to the presence of the deep trench field insulation layers 1080 may be compensated for by the n-type drift region 1030 between the deep trench field insulation layers 1080 in the second direction.

Figure 14:
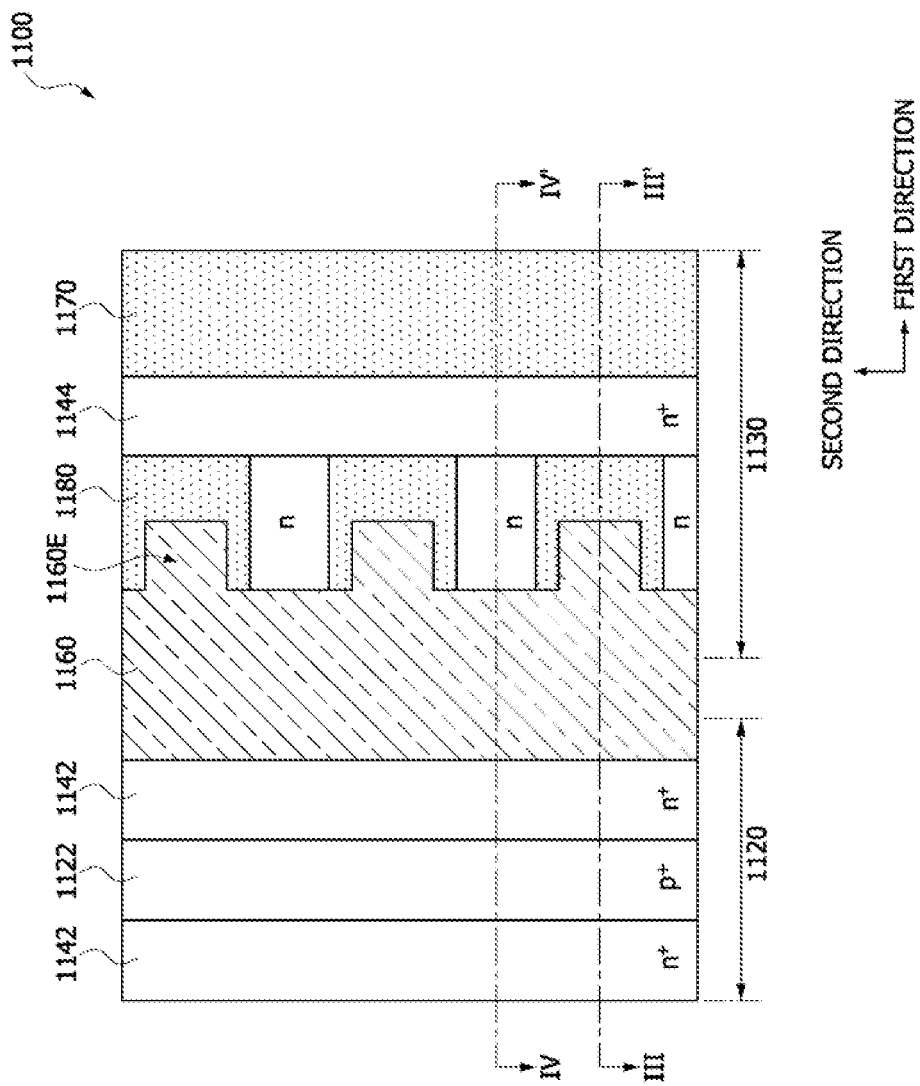
FIG. 14 is a layout diagram illustrating a power integrated device according to still yet another embodiment.
Figure 15:
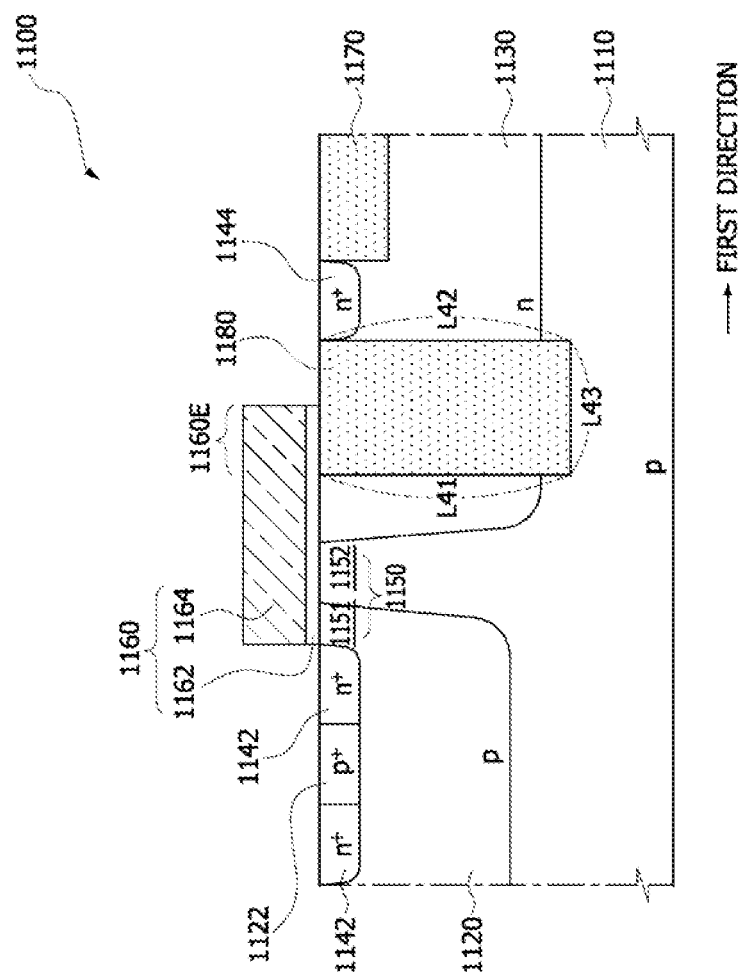
FIG. 15 is a cross-sectional view taken along a line III-III' of FIG. 14.
Figure 16:
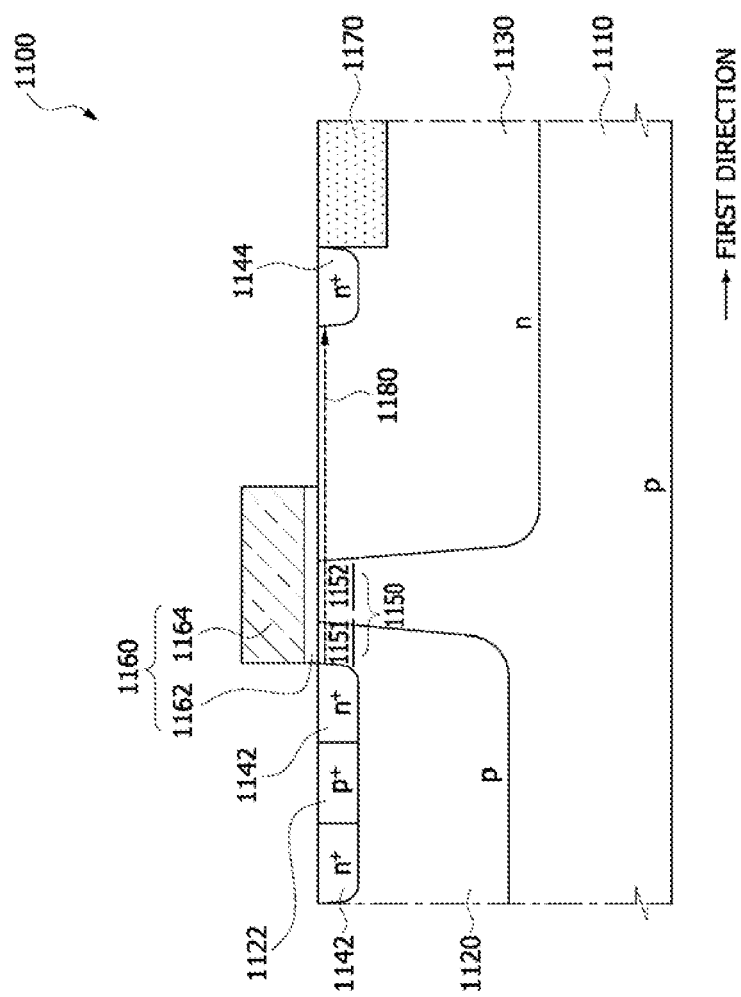
FIG. 16 is a cross-sectional view taken along a line IV-IV' of FIG. 12.

FIG. 14 is a layout diagram illustrating a power integrated device according to still yet another embodiment. FIG. 15 is a cross-sectional view taken along a line III-III' of FIG. 14. FIG. 16 is a cross-sectional view taken along a line IV-IV' of FIG. 14. Referring to FIGS. 14-16, a p-type body region 1120 and an n-type drift region 1130 may be disposed in a p-type semiconductor layer 1110 spaced apart from each other in a first direction. In some embodiments, the p-type semiconductor layer 1110 may be replaced with a p-type well region. A p-type junction region formed in an upper portion of a semiconductor substrate may serve as the p-type well region. Alternatively, the p-type semiconductor layer 1110 may be a p-type epitaxial layer grown on a semiconductor substrate. In the present embodiment, the first direction may correspond to a channel length direction, that is, a direction along which carriers move or currents flow due to an electric field applied between a drain region and a source region. The p-type semiconductor layer 1110 between the P-type body region 1120 and the n-type drift region 1130 may correspond to a first channel region 1152. A p-type body contact region 1122 may be disposed in the p-type body region 1120. The p-type body contact region 1122 may extend in a second direction intersecting the first direction to have a stripe shape. In the present embodiment, the second direction may correspond to a channel width direction.

A couple of n-type source regions 1142 may be disposed at both sides of the p-type body contact region 1122, respectively. The couple of n-type source regions 1142 may be disposed to directly contact both sidewalls of the p-type body contact region 1122, respectively. The p-type body contact region 1122 and the n-type source regions 1142 may be coupled to a source terminal in common. An upper portion of the p-type body region 1120 between the first channel region 1152 and the n-type source regions 1142 may correspond to a second channel region 1151. The first and second channel regions 1152 and 1151 may constitute a channel region 1150 of the lateral power integrated device 1100. An n-type drain region 1144 may be disposed in an upper region of the n-type drift region 1130 opposite to the channel region 1150. The n-type drain region 1144 may extend in the second direction to have a stripe shape. The n-type drain region 1144 may be coupled to a drain terminal.

A gate insulation layer 1162 and a gate electrode 1164 may be sequentially stacked on the channel region 1150. The gate insulation layer 1162 and a gate electrode 1164 constitute a stacked gate 1160. The stacked gate 1160 may extend onto the n-type drift region 1130 between the p-type body region 1120 and the n-type drain region 1144. The stacked gate 1160 may be a stripe shape extending in the second direction. The gate electrode 1164 may be coupled to a gate terminal. The stacked gate 1160 may include a plurality of stacked gate extension portions 1160E each of which protrudes from a sidewall of the stacked gate 1160 in the first direction. The stacked gate extension portions 1160E may be spaced apart from each other in the second direction.

Trench isolation layers 1170 and a plurality of deep trench field insulation layers 1180 may be disposed in the n-type drift region 1130. The trench isolation layer 1170 and the deep trench field insulation layers 1180 may be exposed to a top surface of the n-type drift region 1130. The trench isolation layer 1170 may be disposed at one side of the n-type drain region 1144 to have a stripe shape which is parallel to the n-type drain region 1144. The trench isolation layer 1170 may physically and electrically isolate the power integrated device 1100 from other devices. Each of the deep trench field insulation layers 1180 may be disposed opposite to the trench isolation layer 1170 with respect to the n-type drain region 1144. The trench isolation layer 1170 and each of the deep trench field insulation layers 1180 may directly contact the n-type drain region 1044 in the first direction. The deep trench field insulation layers 1180 may be spaced apart from each other in the second direction. The trench field insulation layers 1180 may overlap with the stacked gate extension portions 1160E, respectively.

Each of the deep trench field insulation layers 1180 may have a first vertical length L41, that is, a first height at a first sidewall, a second vertical length L42, that is, a second height at a second sidewall, and a horizontal length L43, that is, a width measured along a bottom surface in the first direction. In an embodiment, the first height L41 and the second height L42 of the deep trench field insulation layers 1180 may be substantially equal to each other. The first and second heights L41 and L42 of the deep trench field insulation layers 1180 may be greater than the width L43 of the deep trench field insulation layers 1180. For example, the first and second heights L41 and L42 of the deep trench field insulation layers 1180 may be at least 1.2 times greater than the width L43 of the deep trench field insulation layers 1180. The deep trench field insulation layers 1180 may penetrate the n-type drift region 1130 and the bottom surface of the deep trench field insulation layers 1180 may be positioned in the p-type semiconductor layer 1110.

The deep trench field insulation layers 1180 may be disposed in the n-type drift region 1130 between the p-type body region 1120 and the n-type drain region 1144, and the stacked gate extension portion 1160E may be spaced apart from the n-type drain region 1144 by the deep trench field insulation layers 1180. Thus, the deep trench field insulation layers 1180 may suppress a field crowding phenomenon occurring at an edge of the stacked gate extension portion 1160E which is adjacent to the n-type drain region 1144, thereby improving a drain junction breakdown voltage characteristic and a gate dielectric breakdown voltage characteristic of the power integrated device 1100. An increase of the on-resistance value in the n-type drift region 1130 due to the presence of the deep trench field insulation layers 1180 may be compensated for by the n-type drift region 1130 between the deep trench field insulation layers 1180 in the second direction.

What is claimed is:

1. A power integrated device comprising:
a channel region disposed in a first region of a semiconductor layer;
a source region disposed in a second region of the semiconductor layer;
a drift region disposed in a third region of the semiconductor layer, wherein the channel region is disposed between the source region and the drift region in a channel length direction;
a drain region disposed in the drift region;
a stacked gate including a gate insulation layer and a gate electrode and extending from over the channel region to over the drift region;
a plurality of deep trench field insulation layers each of which is disposed in the drift region, and between the stacked gate and the drain region in the channel length direction, sides of the each of the plurality of deep trench field insulation layers being surrounded by the drift region; and
a plurality of stacked gate extension portions which extend from the stacked gate to over the plurality of deep trench field insulation layers in the channel length direction, respectively, the plurality of stacked gate extension portions being spaced apart from each other in a channel width direction,
wherein the plurality of deep trench field insulation layers are separated from each other in the channel width direction,
wherein the drift region has a different conductivity from the first region of a semiconductor layer,
wherein each of the plurality of deep trench field insulation layers has a height greater than a width,
wherein the height is measured in a third direction and the width is measured in the channel length direction,
wherein the third direction is perpendicular to each of the channel length and the channel width directions,
wherein each of the plurality of stacked gate extension portions is entirely overlapped with each of the plurality of deep trench field insulation layers in a plane view, and
wherein each of the plurality of deep trench field insulation layers penetrates the drift region in the third direction and extends down to a level lower than a bottom of the drift region.

2. The power integrated device of claim 1,
wherein the plurality of deep trench field insulation layers extend between the drain region and the stacked gate through under the plurality of stacked gate extension portions in the channel length direction, respectively.

3. The power integrated device of claim 1,
wherein the plurality of deep trench field insulation layers extend under the plurality of stacked gate extension portions, respectively.

4. The power integrated device of claim 1,
wherein the height is at least 1.2 times greater than the width.

5. The power integrated device of claim 1,
wherein the drift region extends from the drain region through between the plurality of stacked gate extension portions to the channel region in the channel length direction.

6. The power integrated device of claim 5, further comprising:
a trench isolation layer disposed in the third region of the semiconductor layer, and
wherein the drain region extends between the trench isolation layer and the plurality of deep trench field insulation layers in the channel length direction, and
wherein the trench isolation layer contacts the drain region.

7. The power integrated device of claim 1, further comprising:
a body region disposed in the semiconductor layer to surround the source region,
wherein the body region is spaced apart from the drift region in the channel length direction.

8. The power integrated device of claim 7, wherein the channel region includes a first channel region and a second channel region,
wherein the first channel region is provided between the body region and the drift region in the channel length direction, and
wherein the second channel region is provided in the body region and between the first channel region and the source region in the channel length direction.

9. The power integrated device of claim 1,
wherein each of the source region, the drain region, and the drift region has a stripe shape extending in the channel width direction.

10. The power integrated device of claim 9,
wherein each of the plurality of deep trench field insulation layers is spaced apart from the drain region.

11. The power integrated device of claim 9,
wherein each of the plurality of deep trench field insulation layers is in a direct contact with the drain region.

* * * * *